(12) United States Patent
Ryu et al.

(10) Patent No.: US 11,594,561 B2
(45) Date of Patent: Feb. 28, 2023

(54) MANUFACTURING METHOD OF DISPLAY DEVICE

(71) Applicant: SAMSUNG DISPLAY CO., LTD., Yongin-si (KR)

(72) Inventors: Yong-Hwan Ryu, Yongin-si (KR); Woo Jin Cho, Yongin-si (KR); Jong-Hyun Choung, Suwon-si (KR); Jae Uoon Kim, Hwaseong-si (KR); Sun-Jin Song, Asan-si (KR); Hyun Duck Cho, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 154 days.

(21) Appl. No.: 17/074,947

(22) Filed: Oct. 20, 2020

(65) Prior Publication Data
US 2021/0327927 A1    Oct. 21, 2021

(30) Foreign Application Priority Data

Apr. 16, 2020  (KR) .................. 10-2020-0046071

(51) Int. Cl.
| H01L 27/12 | (2006.01) |
| G03F 7/038 | (2006.01) |
| H01L 21/027 | (2006.01) |
| G03F 7/00 | (2006.01) |
| C23F 1/00 | (2006.01) |
| C23C 16/44 | (2006.01) |

(52) U.S. Cl.
CPC ........ *H01L 27/1288* (2013.01); *G03F 7/0035* (2013.01); *G03F 7/0382* (2013.01); *H01L 27/1262* (2013.01); *C23C 16/4407* (2013.01); *C23F 1/00* (2013.01)

(58) Field of Classification Search
CPC ............. H01L 27/1288; H01L 27/1262; C23C 16/4407; C23F 1/00; G03F 7/0035
See application file for complete search history.

(56) References Cited

U.S. PATENT DOCUMENTS

| 4,997,522 A |   | 3/1991 | Shokoohi |
| 6,015,650 A | * | 1/2000 | Bae ................. H01L 21/32139 |
|  |  |  | 430/394 |

(Continued)

FOREIGN PATENT DOCUMENTS

| CN | 107689391 A | * | 2/2018 | ......... H01L 29/0684 |
| JP | 2008-047831 |  | 2/2008 |  |

(Continued)

*Primary Examiner* — Mohsen Ahmadi
(74) *Attorney, Agent, or Firm* — F. Chau & Associates, LLC

(57) ABSTRACT

A method of manufacturing a display device in a chamber in which a material including yttrium is coated on an inner surface includes: forming a first layer pattern by dry etching on a substrate; depositing a second layer material on the first layer pattern; forming a photoresist pattern on the second layer material; completing a second layer pattern by using the photoresist pattern as an etch mask; and performing an additional acid etching process by using an etching solution including at least one of hydrochloric acid, sulfuric acid, or nitric acid before the forming of the photoresist pattern on the second layer material after the dry etching to form the first layer pattern.

15 Claims, 24 Drawing Sheets

(56) References Cited

U.S. PATENT DOCUMENTS

| | | | |
|---|---|---|---|
| 2003/0064323 A1* | 4/2003 | Sato | G03F 7/094 |
| | | | 430/311 |
| 2004/0102048 A1* | 5/2004 | Yamaguchi | H01L 21/0332 |
| | | | 257/E21.034 |
| 2004/0266198 A1* | 12/2004 | Yew | H01L 21/31116 |
| | | | 257/E21.252 |
| 2006/0088784 A1* | 4/2006 | Chen | G03F 7/423 |
| | | | 430/256 |
| 2007/0235137 A1* | 10/2007 | Tsukamoto | H01L 21/6875 |
| | | | 156/345.35 |
| 2008/0023442 A1* | 1/2008 | Ito | H01L 27/115 |
| | | | 216/58 |
| 2012/0138921 A1* | 6/2012 | Endo | H01L 27/1288 |
| | | | 257/E21.409 |
| 2014/0234785 A1* | 8/2014 | Hatakeyama | G03F 7/405 |
| | | | 524/378 |
| 2017/0110366 A1* | 4/2017 | Lu | G03F 1/58 |
| 2018/0040736 A1* | 2/2018 | Lin | H01L 29/66969 |
| 2018/0088461 A1* | 3/2018 | Kim | G03F 7/26 |
| 2019/0172848 A1* | 6/2019 | Inoue | H01L 27/1255 |

FOREIGN PATENT DOCUMENTS

| | | |
|---|---|---|
| KR | 10-2005-0110470 | 11/2005 |
| KR | 10-0664403 | 12/2006 |
| KR | 10-1680759 | 11/2016 |

* cited by examiner

FIG. 4

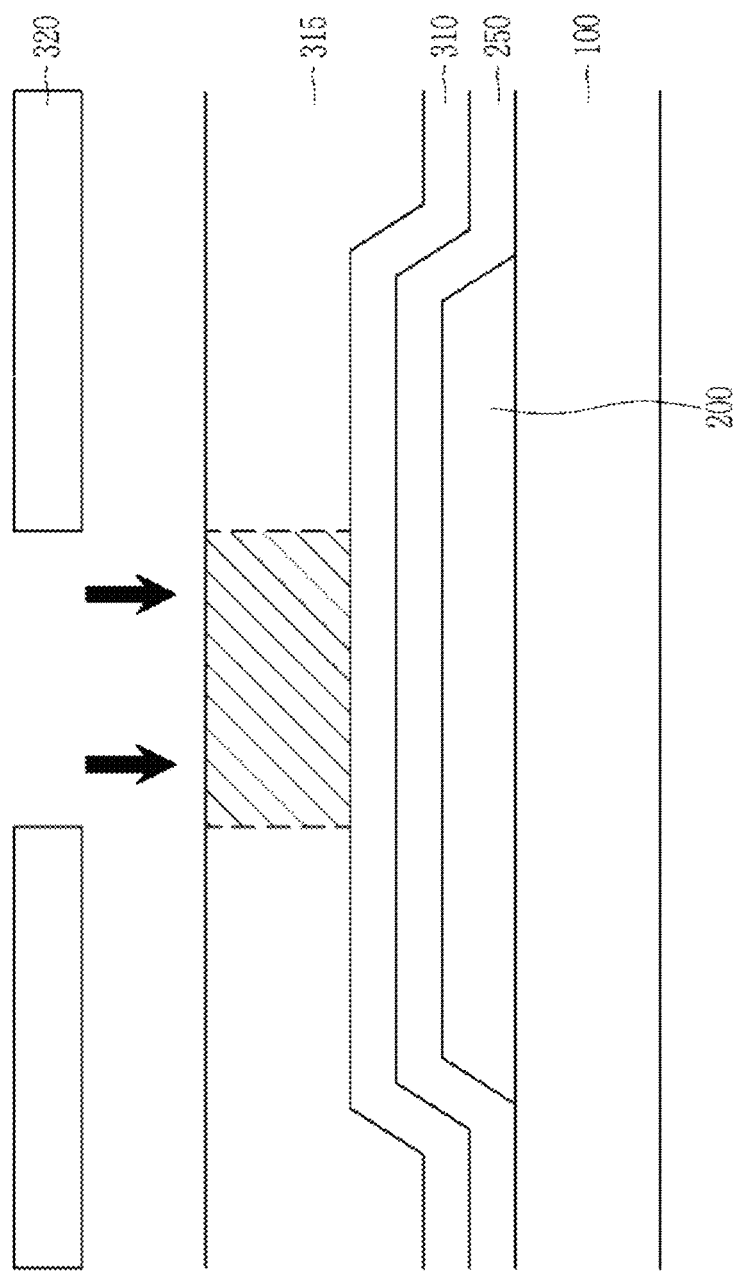

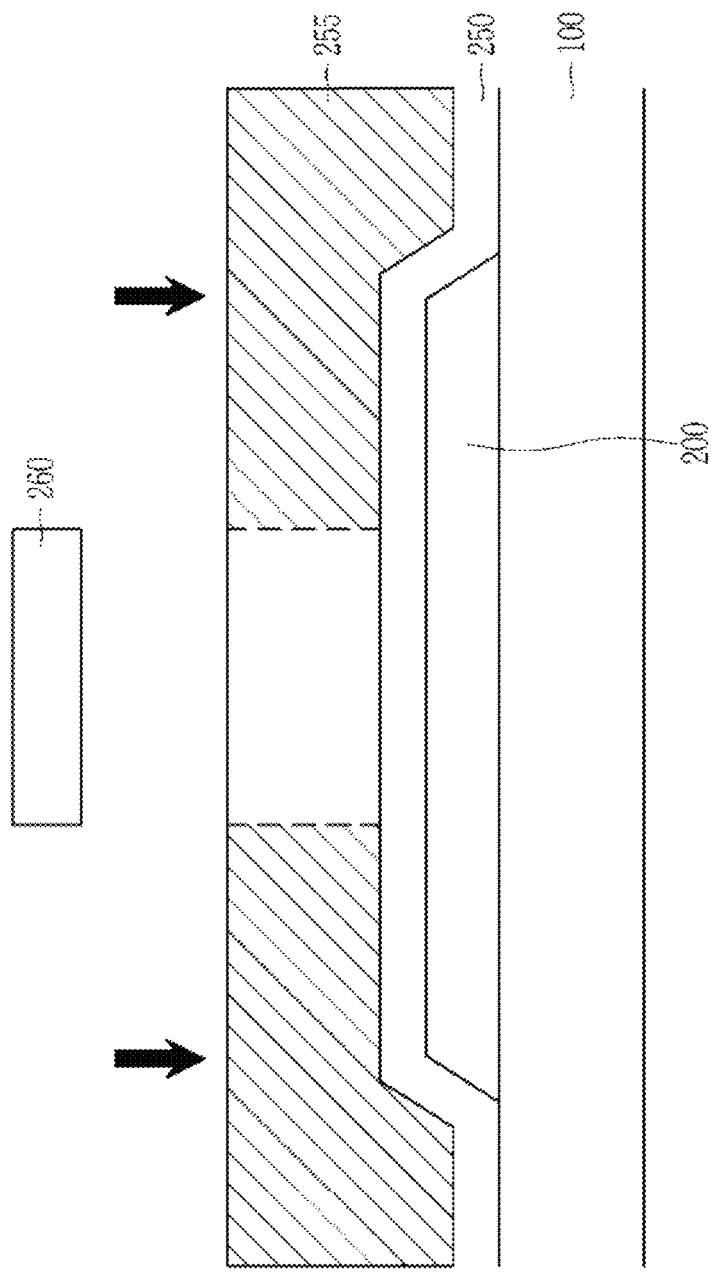

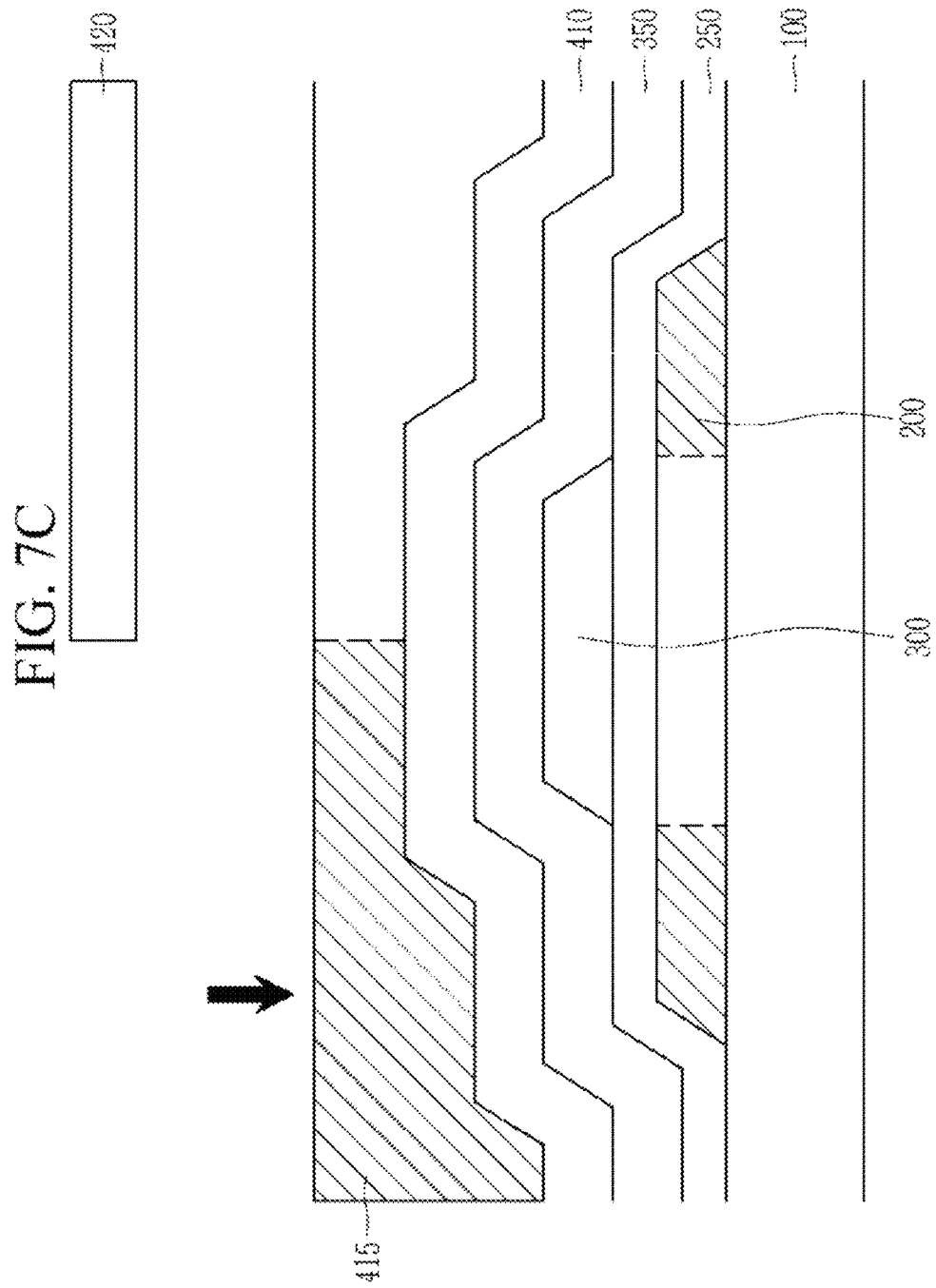

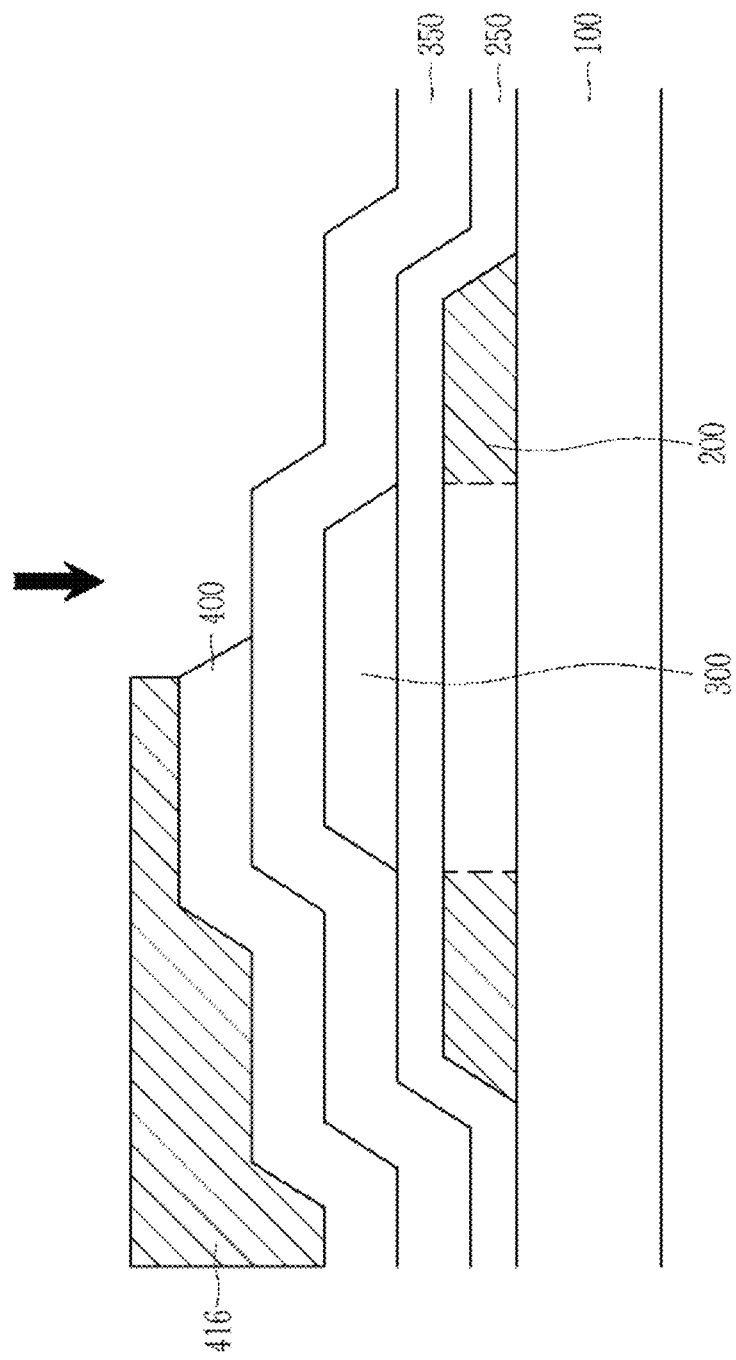

MANUFACTURING METHOD OF DISPLAY DEVICE

CROSS-REFERENCE TO RELATED APPLICATION

This application claims priority under 35 U.S.C. § 119 to Korean Patent Application No. 10-2020-0046071, filed on Apr. 16, 2020, in the Korean Intellectual Property Office, the entire contents of which are incorporated by reference herein.

TECHNICAL FIELD

Exemplary embodiments of the present invention relate to a manufacturing method of a display device, and more specifically, to a manufacturing method of a display device including a process of removing a material containing yttrium.

DISCUSSION OF RELATED ART

A display device is manufactured through a plurality of processes in a chamber having a vacuum characteristic, and the plurality of processes include a dry etching process and an exposure process. In the dry etching process, materials removed from one area may be redeposited onto another area to cause defects in a subsequent process, for example, in the exposure process.

As the size of a pixel of the display device decreases, precision required in each process increases, so without addressing the redeposition issue described above, an inferiority rate may increase with an existing conventional process.

SUMMARY

Exemplary embodiments of the present invention are to provide a manufacturing method of a display device, in which no defect occurs due to a material containing yttrium.

A manufacturing method of a display device according to an exemplary embodiment of the present invention as a method of manufacturing a display device in a chamber in which a material including yttrium is coated on an inner surface includes: forming a first layer pattern by dry etching on a substrate; depositing a second layer material on the first layer pattern; forming a photoresist pattern on the second layer material; completing a second layer pattern by using the photoresist pattern as an etch mask; and performing an additional acid etching process by using an etching solution including at least one of hydrochloric acid, sulfuric acid, or nitric acid before the forming of the photoresist pattern on the second layer material after the dry etching to form the first layer pattern.

The forming of the photoresist pattern on the second layer material may include depositing a photoresist material and completing the photoresist pattern by exposing the photoresist material.

The additional acid etching process may be performed prior to the completing of the photoresist pattern by the exposing of the photoresist material.

The additional acid etching process may be performed between the depositing of the photoresist material and the completing of the photoresist pattern through the exposing of the photoresist material.

The forming of the first layer pattern by the dry etching may include: depositing a first layer material on the substrate; depositing a first photoresist on the first layer material; and exposing the first photoresist to complete the first photoresist pattern.

Removing or cleaning the first photoresist pattern remaining on the first layer pattern after the first layer pattern is completed may be further included.

The additional acid etching process may be performed before the removing or cleaning of the first photoresist pattern.

The additional acid etching process may be performed along with the removing or cleaning of the first photoresist pattern.

The first layer pattern and the second layer pattern may each be independently a conductive layer, a semiconductor layer, or an insulating layer.

The additional acid etching process may remove a first yttrium compound generated by yttrium coating on the inner surface of the chamber.

The first yttrium compound may be $Y_2O_3$.

A carrier substrate attached to the substrate is disposed under the substrate, and the first yttrium compound may be formed on a rear or an edge portion of the rear of the carrier substrate during the dry etching.

The first yttrium compound may be converted into $YF_3$ of a second yttrium compound in a cleaning process.

The first layer pattern may be a semiconductor layer, the second layer pattern may be a gate conductive layer, and the manufacturing method may further include: forming a first gate insulating layer disposed between the semiconductor layer and the gate conductive layer; forming a second gate insulating layer covering the gate conductive layer; and forming a third layer pattern on the second gate insulating layer by using a third layer mask as a photomask, in which the additional acid etching process may be further performed after the completing of the second layer pattern and before exposing with the third layer mask to form the third layer pattern.

All conductive layers formed closer to the substrate than an anode among the conductive layers included in the display device may be formed by the dry etching, and the anode may be formed by wet etching.

An etching solution according to an exemplary embodiment of the present invention includes: at least one of nitric acid with a wt % concentration of about 20% or less; sulfuric acid with a wt % concentration of about 20% or less; and hydrochloric acid with a wt % concentration of about 20% or less, in which the etching solution is used to prevent defect formation by removing an yttrium compound after a dry etching process.

The wt % concentration of nitric acid may be in a range from about 5% to about 10%.

The wt % concentration of sulfuric acid may be in a range from about 2% to about 8%.

The etching solution may further include phosphoric acid or acetic acid, and a wt % concentration of phosphoric acid or acetic acid may be included at about 10% to about 20%.

The yttrium compound may be $Y_2O_3$ or $YF_3$.

A method of manufacturing a display device according an exemplary embodiment of the present invention includes: providing a chamber in which a material including yttrium is coated on an inner surface; forming a first layer pattern by dry etching on a substrate in the chamber; depositing a second layer material on the first layer pattern; performing an acid etching process with an etching solution before or after the depositing of the second layer material, the etching solution including at least one of: nitric acid with a wt % concentration of about 20% or less; sulfuric acid with a wt % concentration of about 20% or less; or hydrochloric acid with a wt % concentration of about 20% or less; and performing a photolithography process and then a dry etching process or a wet etching process on the second layer material to form a second layer pattern.

According to an exemplary embodiment of the present invention, after the material containing yttrium is formed on the side of the glass substrate during the dry etching, even if it is formed to be more easily scattered in the cleaning process, additional etching process is added with a cleaning solution containing acid so as to not form defect patterns such as a short due to the material including yttrium.

BRIEF DESCRIPTION OF THE DRAWINGS

The present invention will be more clearly understood from the following description of the exemplary embodiments, taken in conjunction with the accompanying drawings, in which:

FIG. 4 is a view showing removal of a material including yttrium according to an exemplary embodiment of the present invention;

FIG. 5A to FIG. 5H are cross-sectional views showing a manufacturing method of a display device according to an exemplary embodiment of the present invention in order;

FIG. 6A to FIG. 6D are cross-sectional views showing a manufacturing method of a display device according to an exemplary embodiment of the present invention in order;

FIG. 7A to FIG. 7D are cross-sectional views showing a manufacturing method of a display device according to an exemplary embodiment of the present invention in order.

Figure 1:
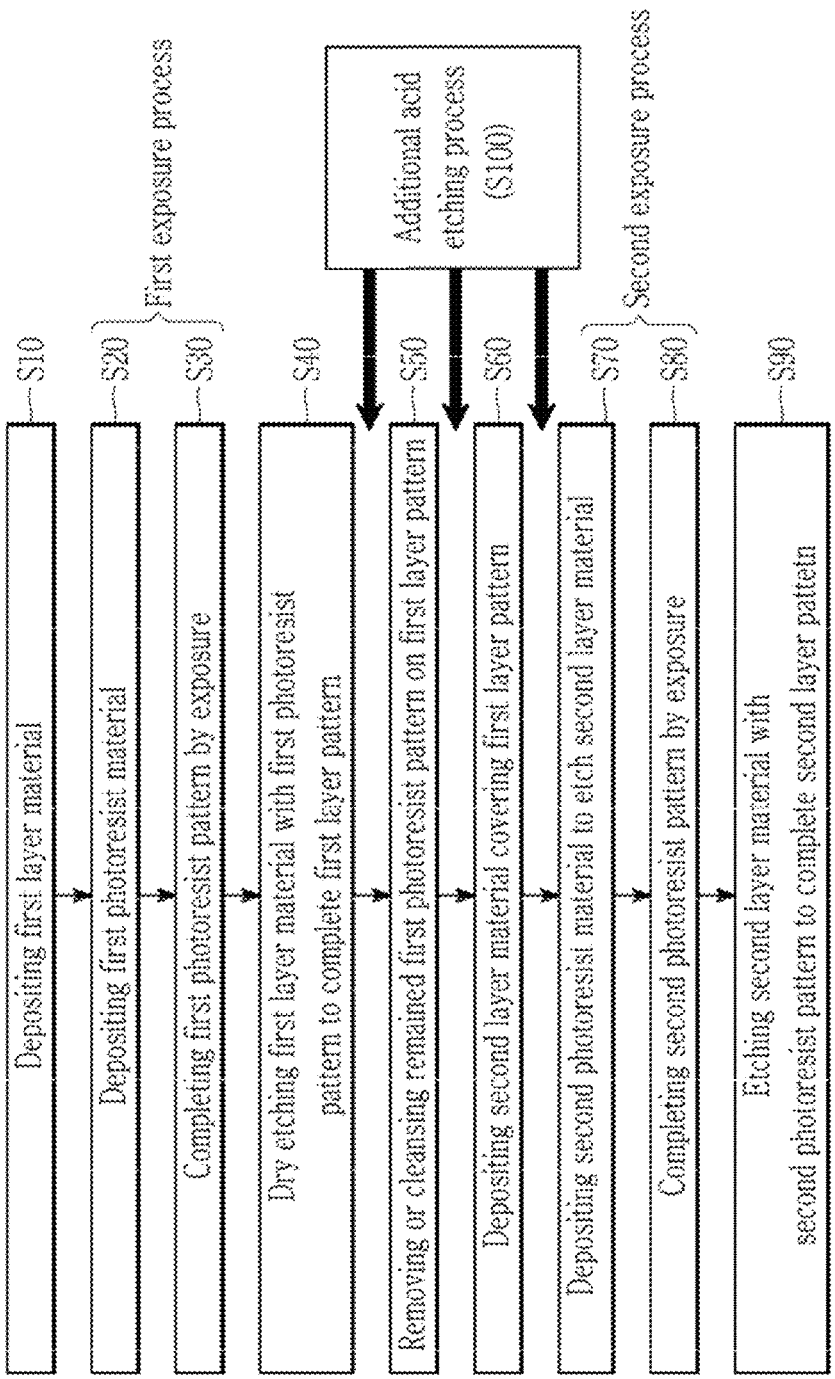
FIG. 1 is a flowchart showing a manufacturing method of a display device according to an exemplary embodiment of the present invention.

Since the drawings in FIGS. 1-11 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present invention will be described more fully hereinafter with reference to the accompanying drawings, in which exemplary embodiments of the present invention are shown. As those skilled in the art would realize, the described exemplary embodiments may be modified in various different ways, all without departing from the spirit or scope of the present invention.

To clearly explain the present invention, portions that are not directly related to the present invention are omitted, and the same reference numerals refer to the same or similar constituent elements throughout the entire specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Throughout the specification, the expression "at least one of a, b or c" indicates only a, only b, only c, both a and b, both a and c, both b and c, all of a, b, and c, or variations thereof. "At least one of A and B" is used herein to select only A, select only B, or select both A and B.

Unless explicitly described to the contrary, the word "comprise", and variations such as "comprises" or "comprising" will be understood to specify the inclusion of stated elements but not the exclusion of any other elements.

In the specification, the phrase "in a plan view" means when an object portion is viewed from the above, and the phrase "in a cross-sectional view" means when a cross-section taken by vertically cutting an object portion is viewed from the side.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, a manufacturing method of a display device according to an exemplary embodiment of the present invention is described with reference to FIG. 1.

FIG. 1 is a flowchart showing a manufacturing method of a display device according to an exemplary embodiment of the present invention.

In FIG. 1, an exemplary embodiment of the present invention is described focusing only on a part of steps of manufacturing a display device, and is illustrated mainly based on steps of forming a first layer and forming a second layer overlying the first layer. A first layer pattern and a second layer pattern may each be a conductive layer, a semiconductor layer, or an insulating layer.

First, a first layer material is deposited on a substrate to form a first layer pattern (S10). Here, the first layer pattern may be one of the various layers (e.g., a conductive layer, a semiconductor layer, and an insulating layer) which are formed through dry etching.

A first photoresist material is deposited on the deposited first layer material (S20). Next, the deposited first photoresist material is exposed to complete a first photoresist pattern (S30). For example, the deposited first photoresist material may go through a photolithography process including, for example, exposure, bake and development processes to form the first photoresist pattern. In the exposure step, the deposited first photoresist material may be exposed through a pattern on a photomask with a radiation such as light. A combination of the steps of depositing the first photoresist material (S20) and completing the deposited first photoresist pattern (S30) is referred to as a first exposure process (S20 and S30).

The first layer material is dry-etched using the first photoresist pattern as an etch mask to complete a first layer pattern (S40). For example, the dry etching process used in completing the first layer pattern may be a reactive ion etching (RIE) process. The reactive ions may etch away the deposited first layer material that is not covered by the first photoresist pattern while leaving area covered by the first photoresist pattern intact to form the first layer pattern.

After the dry etching process, some or most of the first photoresist pattern may be depleted. To prevent the case that the first photoresist pattern on the completed first layer pattern remains, a process of removing or cleaning the first photoresist pattern (S50) is performed. To remove the first photoresist pattern, the first photoresist pattern may be removed by a wet method using a liquid such as a stripper. In addition, the photoresist may also be removed while the cleaning is performed using a cleaning solution. According to an exemplary embodiment of the present invention, only the process of removing the photoresist pattern may be performed, only the cleaning process may be performed, or the cleaning process may be performed after removing the photoresist pattern.

To form a second layer pattern on the completed first layer pattern, a second layer material covering the first layer pattern is deposited (S60). Here, the second layer pattern may be one of the various layers (e.g., a conductive layer, a semiconductor layer, and an insulating layer) according to an exemplary embodiment of the present invention, and the second layer pattern may be formed thereon after an insulating layer covering the completed first layer pattern is placed. At this time, the step of depositing the second layer material (S60) may be performed after the insulating layer covering the completed first layer pattern is formed.

The second photoresist material is deposited on the deposited second layer material (S70) and is exposed to complete the second photoresist pattern (S80). For example, the deposited second photoresist material may go through a photolithography process including, for example, exposure, bake and development processes to form the second photoresist pattern. In the exposure step, the deposited second photoresist material may be exposed through a pattern on a photomask with a radiation such as light. The sum of depositing the second photoresist material (S70) and completing the deposited second photoresist pattern (S80) is referred to as a second exposure process (S70 and S80).

In an exemplary embodiment of the present invention, an additional acid etching process (S100) is performed before the second exposure process (S70 and S80) after the step of completing the first layer pattern through the dry etching (S40). That is, according to an exemplary embodiment of the present invention as illustrated in FIG. 1, the additional acid etching process (S100) may be performed after completing the first layer pattern by the dry etching (S40), the additional acid etching process (S100) may be performed directly after the step of removing or cleaning the first photoresist pattern (S50), or the additional acid etching process (S100) may be performed after depositing the second layer material (S60). The etching solution used here is an acid etching solution containing at least one of hydrochloric acid (HCl), sulfuric acid ($H_2SO_4$), or nitric acid ($HNO_3$) and is for removing a compound containing yttrium (Y). For example, the additional acid etching process may be performed (S100) by using the etching solution including at least one of hydrochloric acid, sulfuric acid, or nitric acid before depositing the second photoresist pattern on the second layer material (S70) after the dry etching to form the first layer pattern (S40). Also, according to an exemplary embodiment of the present invention, the additional acid etching process (S100) may be performed along with the step of the removing or cleaning of the first photoresist pattern (S50). In this case, the acid etching solution (including at least one of hydrochloric acid, sulfuric acid, or nitric acid) used in the additional acid etching process (S100) may be used along with the stripper or the cleaning solution.

After the second exposure process (S70 and S80), the second layer material is etched, for example, through a dry etching process or a wet etching process, using the completed second photoresist pattern as an etch mask to complete the second layer pattern (S90). In this case, the dry etching of the second layer material may be performed the same as shown in the step S40 or the wet etching of the second layer material may be performed unlike the step S40.

In the step S10 of FIG. 1, the position in which the first layer material is deposited may be directly on the substrate or on another layer (a conductive layer, a semiconductor layer, or an insulating layer). At this time, the substrate may be a glass substrate, or a flexible substrate formed of plastic or polyimide (PI) on a carrier substrate formed of glass.

After the second layer pattern is completed (S90), an additional layer (a conductive layer, a semiconductor layer, an insulating layer, an electrode layer, an encapsulation layer, etc.) may be formed to form the display device.

In FIG. 1, an additional insulating layer may be disposed between the first layer pattern and the second layer pattern, and in this case, the insulating layer may not include an opening formed for electrical connection between the overlying and underlying conductive layers. For example, the additional insulating layer may be disposed to prevent electrical connection between two semiconductor layers, between two conductive layers, or between a semiconductor layer and a conductive layer. When the opening is formed in the insulating layer, the insulating layer may be the first layer pattern.

As in an exemplary embodiment of the present invention, to perform the additional acid etching process (S100) after the dry etching (S40) and before the next exposure process (the second exposure process S70 and S80) is to remove the compound containing yttrium (Y) so that a defect is not generated in the second layer pattern due to the yttrium compound included in the second photoresist pattern.

Hereinafter, a situation in which a material such as a compound containing yttrium (Y) occurs in the manufacturing process of the display device will be described in detail with reference to FIG. 2.

Figure 2:
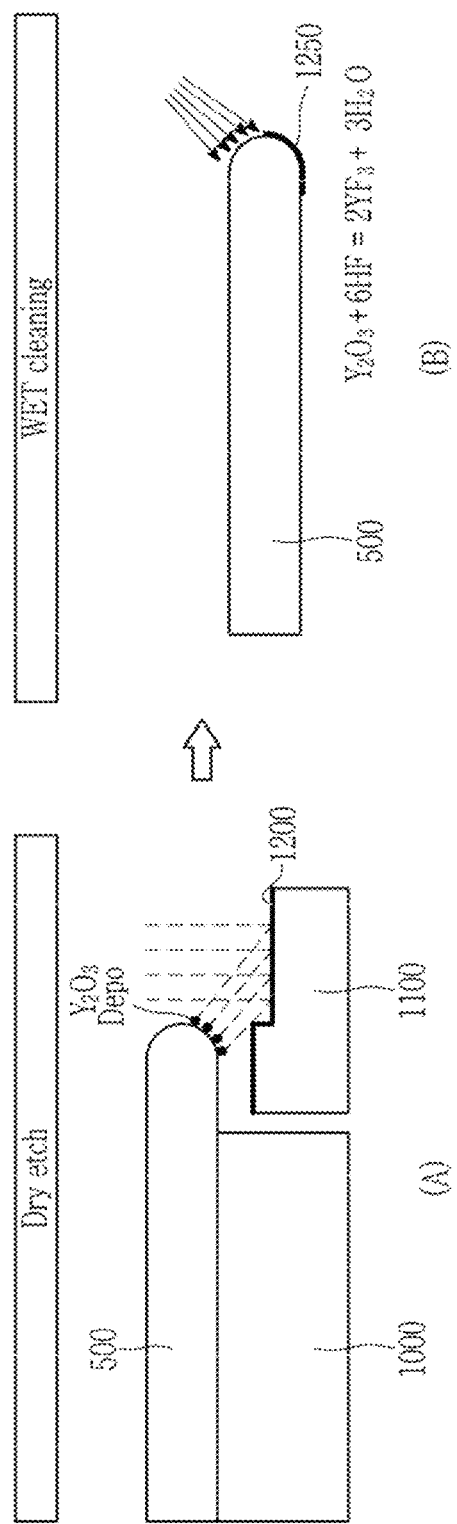
FIG. 2 is a view showing a procedure in which a material containing yttrium is formed on a lower surface of a glass substrate according to an exemplary embodiment of the present invention.

FIG. 2 is a view showing a procedure in which a material containing yttrium (Y) is formed on a lower surface of a glass substrate according to an exemplary embodiment of the present invention.

The various deposition processes, etching processes, etc. for manufacturing the display devices are performed in a chamber formed in a vacuum state, and yttrium (Y) may be coated on the inner surface of the chamber and used to extend the life of the chamber and allow it to be used for a long time. The material including yttrium (Y) used during the coating in the present exemplary embodiment may be a first yttrium compound ($Y_2O_3$), for example, yttrium oxide ($Y_2O_3$).

The coated yttrium 1200 is shown in FIG. 2(A).

In FIG. 2 (A), the chamber is simply illustrated, and the chamber includes a support portion 1000 supporting a carrier substrate 500 and a portion (1100; hereinafter referred to as an exposed portion), that is not covered by the carrier substrate 500, to be exposed. In addition, the processes of depositing and etching each layer to form the display device on the upper surface of the carrier substrate 500 are performed, and the carrier substrate 500 is formed of glass. According to an exemplary embodiment of the present invention, to form a flexible display device, after further forming a flexible substrate of a plastic or polyimide (PI) material on the upper surface of the carrier substrate 500, each layer may be formed on the flexible substrate. In an exemplary embodiment of the present invention, the carrier substrate 500 may be a rigid substrate, and may be used to carry the flexible substrate of a plastic or polyimide (PI) material thereon inside and outside the chamber. Thereafter, the flexible substrate and the overlying layer may be separated from the carrier substrate 500 to form the flexible display device.

The inner surface of the chamber is coated with yttrium as a whole, so the upper surface of the exposed portion 1100 is coated with yttrium (the first yttrium compound ($Y_2O_3$; 1200)). During the dry etching process (FIG. 2 (A)), as the upper surface of the carrier substrate 500 is etched, yttrium of the exposed portion 1100 is also sputtered, and the first yttrium compound ($Y_2O_3$) is deposited on the back or the edge portion of the back side of the carrier substrate 500. For example, in the exemplary embodiment of FIG. 1, when the first layer material is dry-etched using the first photoresist pattern as an etch mask to complete a first layer pattern (S40), the first yttrium compound ($Y_2O_3$) may be deposited on the back or the edge portion of the back side of the carrier substrate 500.

When a wet process such as a cleaning process proceeds, as shown in FIG. 2 (B), the first yttrium compound ($Y_2O_3$) deposited on the back or the edge portion of the back of the carrier substrate 500 is reacted with a cleaning solution (e.g., BOE (a buffered oxide etchant)) and then is changed to a state that is easily separated from the carrier substrate 500 while being changed into a second yttrium compound ($YF_3$; 1250), for example, yttrium fluoride ($YF_3$). The BOE cleaning solution is a buffered hydrofluoric acid (HF) mixture. Looking at a chemical reaction shown in FIG. 2 (B) in more detail, since the BOE cleaning solution contains HF and ammonium fluoride ($NH_4F$), the cleaning is performed while removing the silicon oxide ($SiO_2$) layer, of which HF reacts with the first yttrium compound ($Y_2O_3$), thereby being converted into a second yttrium compound ($YF_3$) and water ($H_2O$). Through this, the second yttrium compound ($YF_3$; 1250) has a characteristic that it may be separated from the carrier substrate 500 more easily than the first yttrium compound ($Y_2O_3$).

The second yttrium compound ($YF_3$; 1250) is separated from the carrier substrate 500 and is scattered in the subsequent process and may cause defects in the subsequent process. Such defects may cause incorrect forming of the photoresist pattern in the exposure process, or in other case, cause electrically connecting (shorting) two conductive layers while being disposed in a portion without a conductive layer among the formed conductive layer patterns.

FIG. 2 shows the first yttrium compound ($Y_2O_3$) and the second yttrium compound ($YF_3$), but various yttrium compounds may be included in the process when changing the yttrium compound to be coated on the chamber or the cleaning solution used for cleaning. Accordingly, a process capable of removing various compounds including yttrium (Y) is desirable to remove defects occurring in the subsequent process.

As shown in FIG. 1, the additional acid etching process (S100) is performed until the next exposure process (the second exposure process S70 and S80) after the dry etching (S40). In the dry etching step S40 in FIG. 1, the first yttrium compound ($Y_2O_3$) may be deposited on the back or the edge portion of the back side of the carrier substrate 500. The etching solution used at this time is the acid etching solution containing at least one of hydrochloric acid, sulfuric acid, or nitric acid, and the effect of removing the compound layer containing yttrium (Y) is described with reference to FIG. 3 and FIG. 4.

Figure 3:
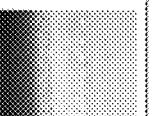
FIG. 3 is a view showing whether or not a material containing yttrium is removed according to a comparative example and an exemplary embodiment of the present invention.
Figure 4:
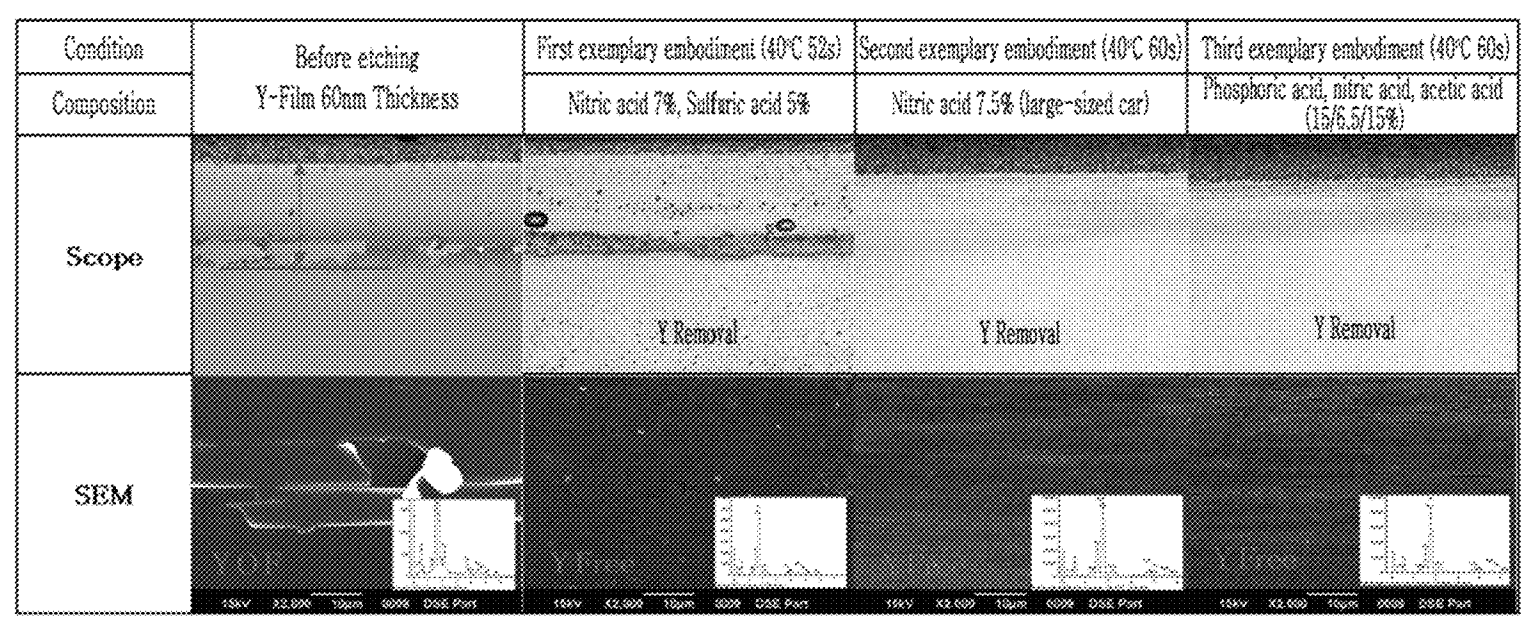

FIG. 3 is a view showing whether or not a material containing yttrium (Y) is removed according to a comparative example and an exemplary embodiment of the present invention, and FIG. 4 is a view showing removal of a material including yttrium (Y) according to an exemplary embodiment of the present invention.

First, FIG. 3 shows the results of experimenting on whether the yttrium compound layer (a Y-Film) is removed by using various acids.

The Y-Film shown in FIG. 3 represents the deposited second yttrium compound $YF_3$ and is the result of experimenting with the removal characteristic based on the second yttrium compound $YF_3$.

FIG. 3 shows whether the yttrium compound layer (Y-Film) is removed after performing the wet etching for 120 seconds with a concentration of 5 wt % for each acid by using the etching solution containing phosphoric acid ($H_3PO_4$), acetic acid ($CH_3COOH$), hydrochloric acid (HCl), sulfuric acid ($H_2SO_4$), and nitric acid ($HNO_3$). That is, in FIG. 3, "Initial" refers to before the progress of the additional acid etching process (S100), "5% 120 Second" means after the wet etching for 120 seconds with the 5 wt % concentration of each acid used, and "SEM" means a SEM (Scanning Electron Microscope) photograph taken after the wet etching for 120 seconds with the 5 wt % concentration of each acid used. "Removal X" means the Y-Film not being removed, and "Removal O" means the Y-Film being removed.

In the case of the etching solution containing hydrochloric acid, sulfuric acid, and/or nitric acid, it may be confirmed that the yttrium compound layer (Y-Film) is removed, but when the etching solution containing only phosphoric acid or acetic acid is used, it may be confirmed that the yttrium compound layer (Y-Film) still remains.

Based on the result of FIG. 3, it may be confirmed that the etching solution used in the additional acid etching process (S100) should include at least one of hydrochloric acid, sulfuric acid, or nitric acid. Phosphoric acid or acetic acid may be additionally included when one of hydrochloric acid, sulfuric acid, or nitric acid is included.

Based on the experimental results of FIG. 3, as shown in FIG. 4, the experiments are performed while changing the wt % concentration, and the results of the experiments including sulfuric acid, phosphoric acid, and acetic acid based on nitric acid among hydrochloric acid, sulfuric acid, and nitric acid are shown in FIG. 4. That is, each of the etching solutions used in the experiments shown in FIG. 4 includes nitric acid.

The etching solution to be used in FIG. 4 is three, the etching solution of the first exemplary embodiment has the wt % concentration of nitric acid at 7% and sulfuric acid at 5%, the etching solution of the second exemplary embodiment has the wt % concentration of nitric acid at 7.5%, and the etching solution of the third exemplary embodiment has the wt % concentration of phosphoric acid at 15%, nitric acid at 6.5%, and acetic acid at 15%.

In FIG. 4, after showing that the yttrium compound layer (Y-Film) before the etching is disposed leftmost, each exemplary embodiment with a specific composition is shown after being used to etch the yttrium compound layer (Y-Film) under a specific condition.

First, the etching solution (the wt % concentration of nitric acid at 7% and sulfuric acid at 5%) of the first exemplary embodiment is after the etching of the yttrium compound layer (Y-Film) for 52 seconds (s) at 40° C., and it may be confirmed that the yttrium compound layer (Y-Film) is removed.

The etching solution (the wt % concentration of nitric acid at 7.5%) of the second exemplary embodiment is after the etching of the yttrium compound layer (Y-Film) for 60 seconds (s) at 40° C., and it may be confirmed that the yttrium compound layer (Y-Film) is removed.

The etching solution (the wt % concentration of phosphoric acid at 15%, nitric acid at 6.5%, and acetic acid at 15%) of the third exemplary embodiment is after the etching of the yttrium compound layer (Y-Film) for 60 seconds (s) at 40° C., and it may be confirmed that the yttrium compound layer (Y-Film) is removed.

According to the experimental results of FIG. 4, in the case of nitric acid, it may be confirmed that the yttrium compound layer (Y-Film) is easily removed even when the wt % concentration of only about 6% to about 8% is included. If the wt % concentration of nitric acid is about 20% or less, the yttrium compound may be sufficiently removed by the etching, and if the wt % concentration of sulfuric acid and hydrochloric acid is less than about 20% corresponding to nitric acid, the yttrium compounds may be sufficiently removed by the etching. For example, the etching solution with the above described acid or acids having the above described wt % concentration may be used to prevent defect formation by removing the yttrium compound after the dry etching process.

Based on each exemplary embodiment of FIG. 4, the etching solution may include about 5% to about 10% of the wt % concentration of nitric acid and about 2% to about 8% of the wt % concentration of sulfuric acid. Also, according to an exemplary embodiment of the present invention, the etching solution may include about 5% to about 10% of the wt % concentration of nitric acid, and further, according to an exemplary embodiment of the present invention, in addition to nitric acid with the concentration wt % of about 5% to about 10%, phosphoric acid and acetic acid each with the concentration wt % of about 10% to about 20% may be included, respectively.

Hereinafter, the process shown comprehensively in FIG. 1 is examined in more detail.

First, in FIG. 5A to FIG. 5H, an exemplary embodiment of the present invention in which a conductive layer is used as the first layer pattern and as the second layer pattern and an insulating layer 250 is disposed therebetween is described. In FIG. 5A to FIG. 5H, according to an exemplary embodiment of the present invention, the first layer pattern or the second layer pattern may be a semiconductor layer. In FIG. 5A to FIG. 5H, according to an exemplary embodiment of the present invention, each of the first layer pattern and the second layer pattern may be a semiconductor layer.

FIG. 5A to FIG. 5H are cross-sectional views showing a manufacturing method of a display device according to an exemplary embodiment of the present invention in order.

Figure 5A:
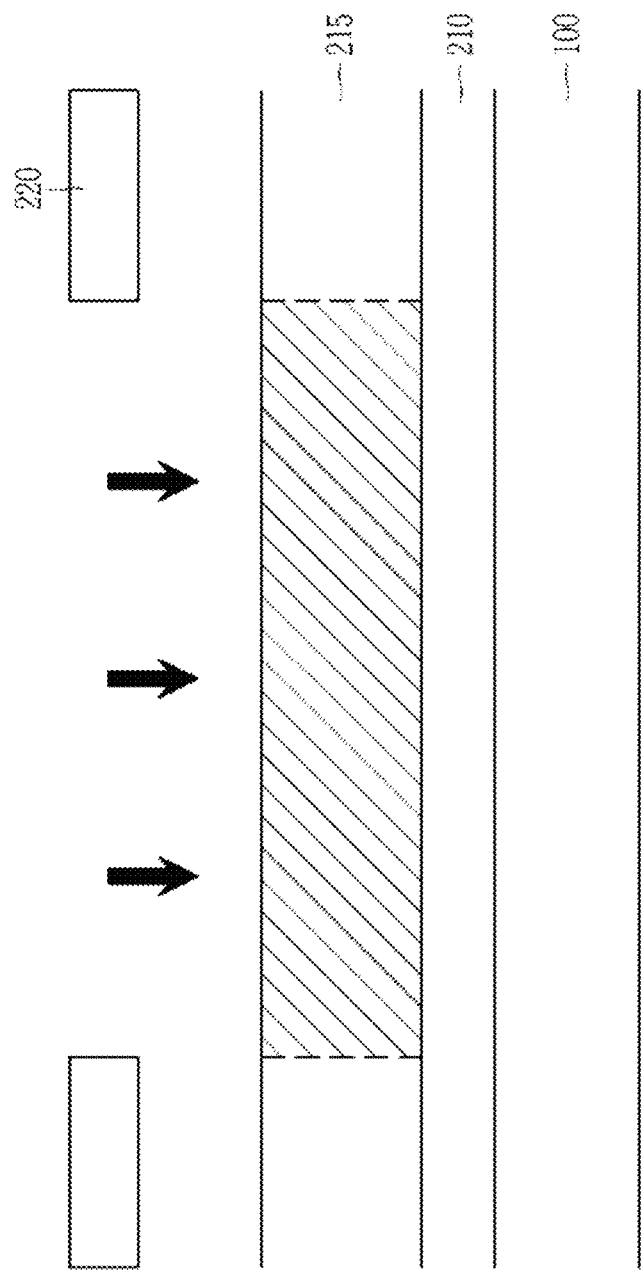

First, FIG. 5A shows a step in which a first layer material 210 is deposited on a substrate 100, and then a first photoresist material 215 is deposited thereon and is exposed by using a first mask 220. For example, the first photoresist material 215 may be exposed with a radiation (light) through the first mask 220.

Figure 5B:
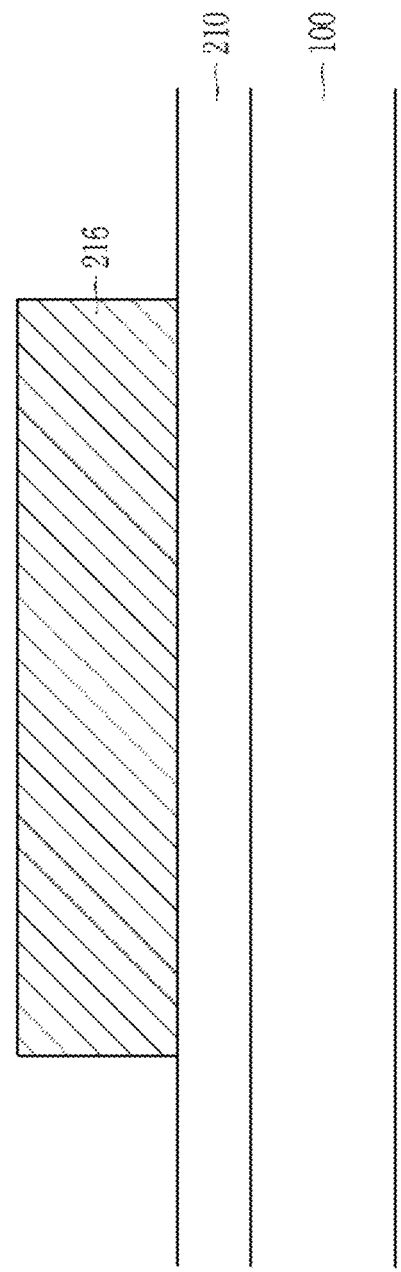

Some regions of the first photoresist material 215 receive light through the exposure, so that the characteristic thereof changes, and it is removed or remains during the development depending on the changed characteristic. For example, the first photoresist material 215 may be a positive tone photoresist material with the exposed portion being removed or a negative tone photoresist material with the exposed portion remaining after the development. FIG. 5B shows after the first photoresist pattern 216 is completed through the development process, and in the exemplary embodiment of FIG. 5B, it may be confirmed that the exposed first photoresist material 215 remains after the development process. For example, the first photoresist material 215 may be a negative tone photoresist material, so that the exposed portion remains after the development process.

Figure 5C:
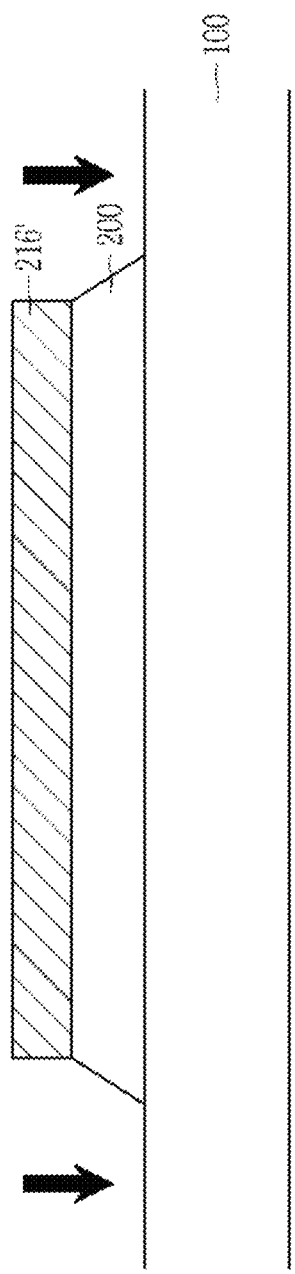

As shown in FIG. 5C, a first layer pattern 200 is completed by dry-etching the first layer material 210 using the first photoresist pattern 216 as an etch mask. At this time, the first photoresist pattern 216 is also dry etched and the height is lowered. As a result, the remaining first photoresist 216' is disposed on the first layer pattern 200.

Figure 5D:
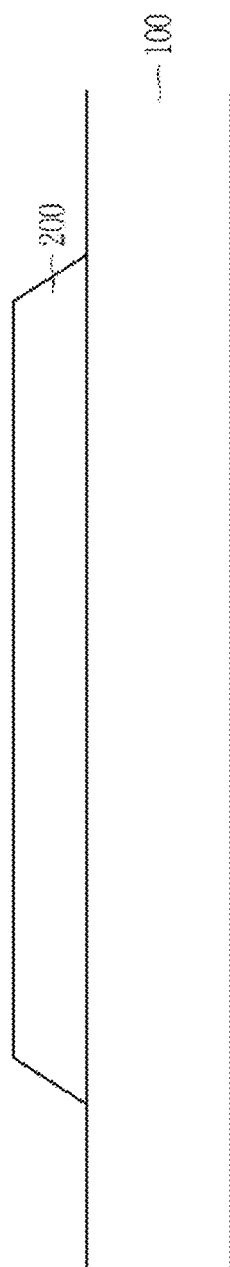

If the remaining first photoresist 216' is removed using a stripper liquid which is an etchant of a wet chemical etching process, as shown in FIG. 5D, only the completed first layer pattern 200 remains. Alternatively, the remaining first photoresist 216' may be removed by a plasma ashing process which is a dry etching process.

Figure 5E:
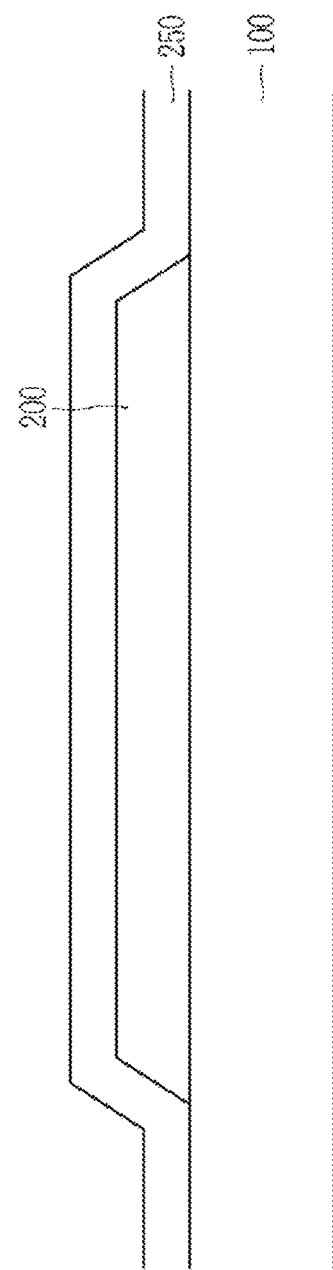
Figure 5F:
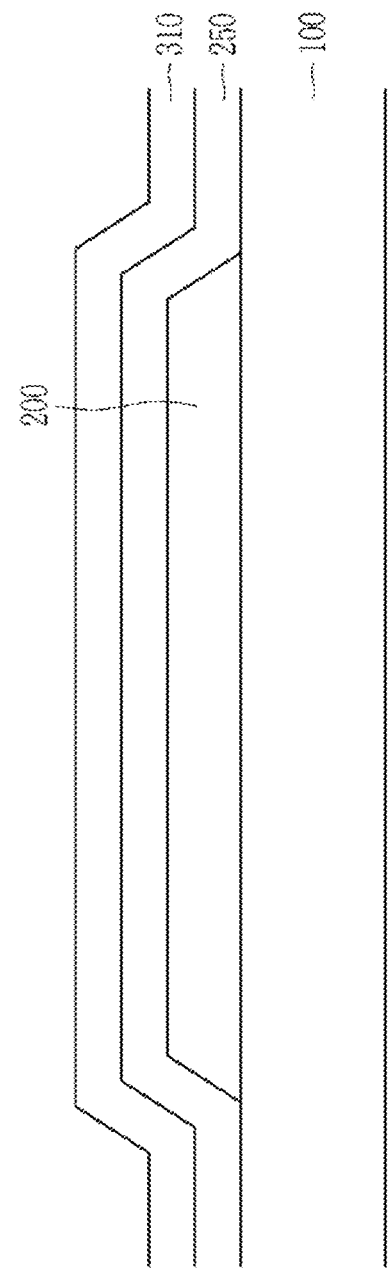

Next, as shown in FIG. 5E, the insulating layer 250 is deposited on the completed first layer pattern 200, and next, as shown in FIG. 5F, a second layer material 310 is deposited on the insulating layer 250. Here, the insulating layer 250 may be an inorganic insulating layer or an organic insulating layer, and in the case of the inorganic insulating layer, it may include silicon oxide ($SiO_2$) or silicon nitride ($Si_3N_4$), and also, a plurality of layers may be formed by respectively including a layer containing silicon oxide ($SiO_2$) and a layer including silicon nitride ($Si_3N_4$).

Next, as shown FIG. 5G, a second photoresist material 315 is deposited on the second layer material 310, and then the second photoresist material 315 is exposed by using a second mask 320 as a photomask. For example, the second photoresist material 315 may be exposed with a radiation (light) through the second mask 320. In the present exemplary embodiment, the second photoresist material 315 of the exposed region remains to form a second photoresist pattern 316. For example, the second photoresist material 315 may be a negative tone photoresist material.

Figure 5H:
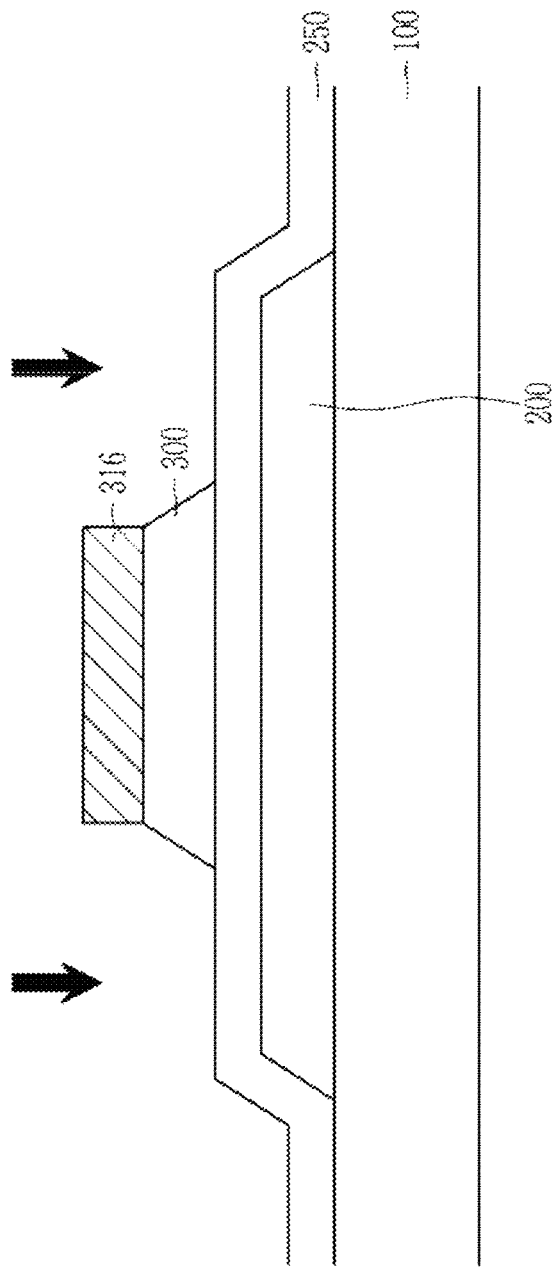

Next, as shown in FIG. 5H, the second layer material 310 is etched using the second photoresist pattern 316 as an etch mask to complete a second layer pattern 300.

In an exemplary embodiment of the present invention, an additional acid etching process is performed after the process of FIG. 5C before the exposure process of FIG. 5G. For example, the additional acid etching process may be performed after the dry-etching of the first layer material 210 using the first photoresist pattern 216 as an etch mask, and before depositing the second photoresist material 315 on the second layer material 310. A time when the additional acid etching process is performed may be after the process of FIG. 5C, after the process of FIG. 5E, or after the process of 5F. For example, the remaining first photoresist 216' after the process of FIG. 5C is wet-etched and removed by a stripper, etc., and at this time, the yttrium compound may be removed by adding the acid etching solution containing at least one of hydrochloric acid, sulfuric acid, or nitric acid. For example, the photoresist stripping process may be combined with the additional acid etching process, so that the yttrium compound may be removed during the process of removing the remaining first photoresist 216'. In addition, the step of removing the first photoresist 216' by using the stripper and the additional acid etching process may be separately performed.

Through this additional acid etching process, even if the yttrium compound is formed at the rear or the edge portion of the rear of the carrier substrate 500 disposed under the substrate 100 during the dry etching, it is removed, and defects do not occur due to the yttrium compound in the subsequent process.

After the process of FIG. 5H, the remaining second photoresist pattern 316 may be removed by the stripper.

When etching the second layer material 310, in the case of performing the dry etching, to remove defects caused by the yttrium compound in the subsequent step, the additional acid etching process of removing the yttrium compound using the etching solution containing at least one of hydrochloric acid, sulfuric acid, or nitric acid may be further performed after the process of FIG. 5H. Alternatively, the remaining second photoresist pattern 316 after the process of FIG. 5H may be removed by a stripper having the acid etching solution containing at least one of hydrochloric acid, sulfuric acid, or nitric acid added therein, such that the yttrium compound may also be removed at the same time.

In FIG. 5A to FIG. 5H, the first layer pattern 200 is disposed directly on the substrate 100, however, according to an exemplary embodiment of the present invention, an additional layer or multiple additional layers may be disposed between the substrate 100 and the first layer pattern 200.

The carrier substrate 500 is disposed under the substrate 100 such that it is possible to help move the substrate 100 and each layer formed thereon inside and outside the chamber. Here, the carrier substrate 500 may be a glass material, and the substrate 100 used in the display device may be a glass material or a flexible material such as a plastic or polyimide (PI). In an exemplary embodiment of the present invention, the carrier substrate 500 may be a rigid substrate, and the substrate 100 may be a flexible substrate. However, the present invention is not limited thereto.

Hereinafter, an exemplary embodiment of the present invention in which that the second layer pattern 300 is an insulating layer is described with reference to FIG. 6A to FIG. 6D, and the first layer pattern 200 may be a conductive layer or a semiconductor layer.

FIG. 6A to FIG. 6D are cross-sectional views showing a manufacturing method of a display device according to an exemplary embodiment of the present invention in order.

Figure 6A:
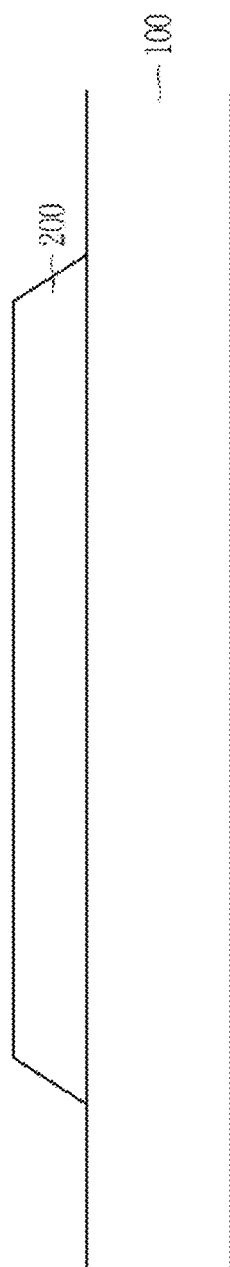

FIG. 6A shows a step in which the completed first layer pattern 200 is formed on the substrate 100 similar to that of FIG. 5D. As a result, the process of forming the completed first layer pattern 200 may be the same as that of FIG. 5A to FIG. 5C and is omitted for simplicity and to avoid duplication.

Figure 6B:
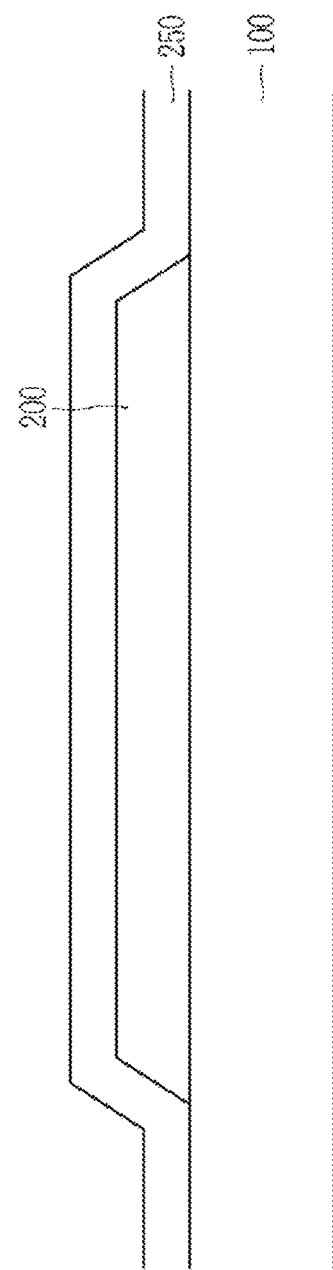

Next, as shown in FIG. 6B, an insulating layer 250 covering the completed first layer pattern 200 is formed. Here, the insulating layer 250 may be an inorganic insulating layer or an organic insulating layer, and in the case of the inorganic insulating layer, it may include silicon oxide ($SiO_2$) or silicon nitride ($Si_3N_4$), and also, a plurality of layers may be formed by respectively including a layer containing silicon oxide ($SiO_2$) and a layer including silicon nitride ($Si_3N_4$).

Next, as shown in FIG. 6C, a photoresist material 255 for an insulating layer is deposited and exposed by using a mask 260. For example, the photoresist material 255 may be a negative tone photoresist material, and may be exposed with a radiation (light) through the mask 260.

Figure 6D:
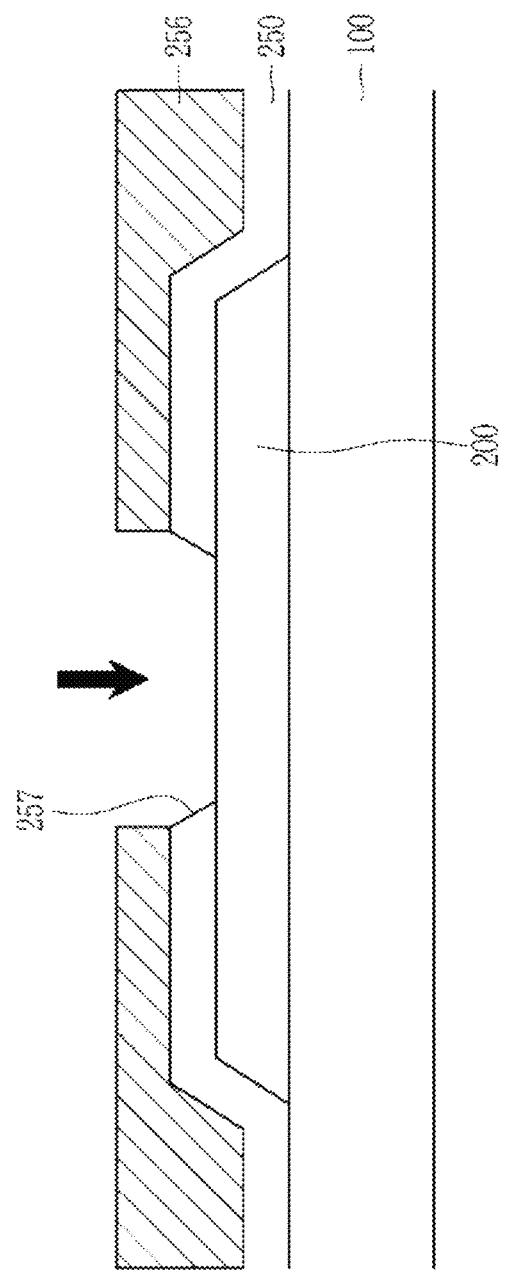

Next, as shown in FIG. 6D, the exposed photoresist material 255 for the insulating layer is developed to form an insulating layer photoresist pattern 256, and the insulating layer 250 is etched using the insulating layer photoresist pattern 256 as an etch mask to form an opening 257. A portion of the first layer pattern 200 is exposed through the opening 257.

Thereafter, in the subsequent process, a conductive layer may be formed to be in contact with the first layer pattern 200 through the opening 257.

In an exemplary embodiment of the present invention, the additional acid etching process is performed before the process of FIG. 6C, in which the photoresist material is deposited and then exposed with a radiation (light) through the mask 260, after the dry-etching of the first layer material 210 to form the first layer pattern 200. In FIG. 6A, since the photoresist is removed after the dry etching, the additional acid etching process may be performed after or before the process of removing the photoresist after the dry etching or along with the process of removing the photoresist. In addition, before and after the process illustrated in FIG. 6B as a next step, that is, before or after the depositing of the insulating layer 250, an additional acid etching process may be performed. At this time, the etching solution used includes at least one of hydrochloric acid, sulfuric acid, or nitric acid.

Through this additional acid etching process, even if the yttrium compound is formed at the rear or the edge portion of the rear of the carrier substrate 500 disposed under the substrate 100 during the dry etching, it is removed, and defects do not occur due to the yttrium compound in the subsequent process.

After the process of FIG. 6D, the remaining photoresist pattern 256 is removed by a stripper through a stripping process.

In FIG. 6A to FIG. 6D, it is shown that the first layer pattern 200 is disposed directly on the substrate 100, however according to an exemplary embodiment of the present invention, an additional layer or multiple additional layers may be disposed between the substrate 100 and the first layer pattern 200. The carrier substrate 500 may be disposed under the substrate 100.

Hereinafter, an exemplary embodiment of the present invention in which a third layer is additionally formed as well as the first layer and the second layer is described with reference to FIG. 7A to FIG. 7D. In FIG. 7A to FIG. 7D, the first layer pattern 200 is a semiconductor layer, and the second layer pattern 300 and the third layer pattern 400 are conductive layers according to an exemplary embodiment of the present invention.

FIG. 7A to FIG. 7D are cross-sectional views showing a manufacturing method of a display device according to an exemplary embodiment of the present invention in order.

Figure 7A:
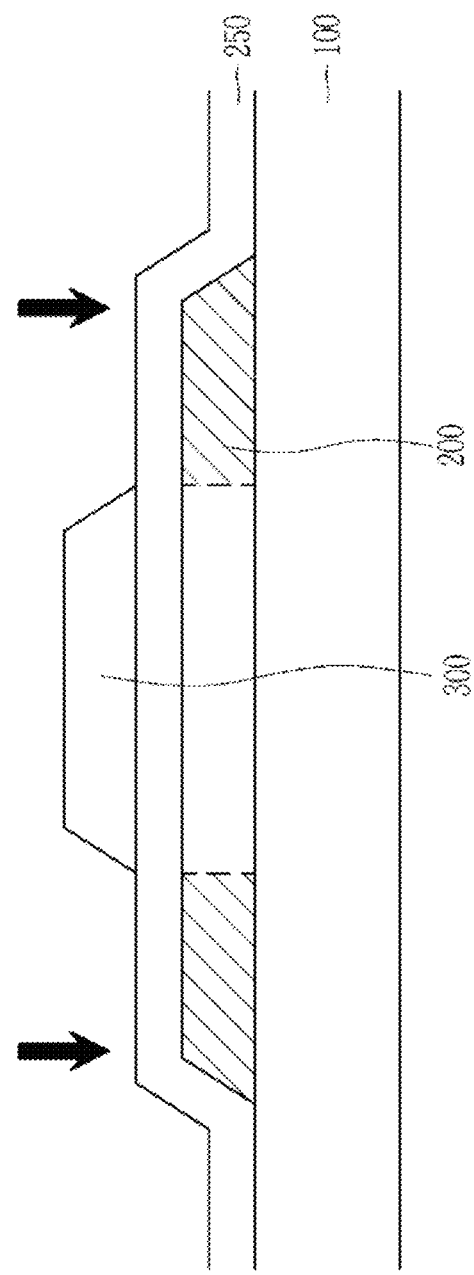

FIG. 7A may be a step in which the second photoresist pattern 316 in FIG. 5H is removed. As a result, after dry etching the first layer pattern 200, the additional acid etching process may be performed with the etching solution containing at least one of hydrochloric acid, sulfuric acid, or nitric acid.

FIG. 7A shows a process of doping the first layer pattern 200 of the semiconductor layer using the second layer pattern 300 as an ion implantation mask. For example, the doping process may be performed by ion implantation. By the doping process, the first layer pattern 200, which is a semiconductor layer, is divided into a doped region (a hatched portion) and a non-doped region.

Figure 7B:
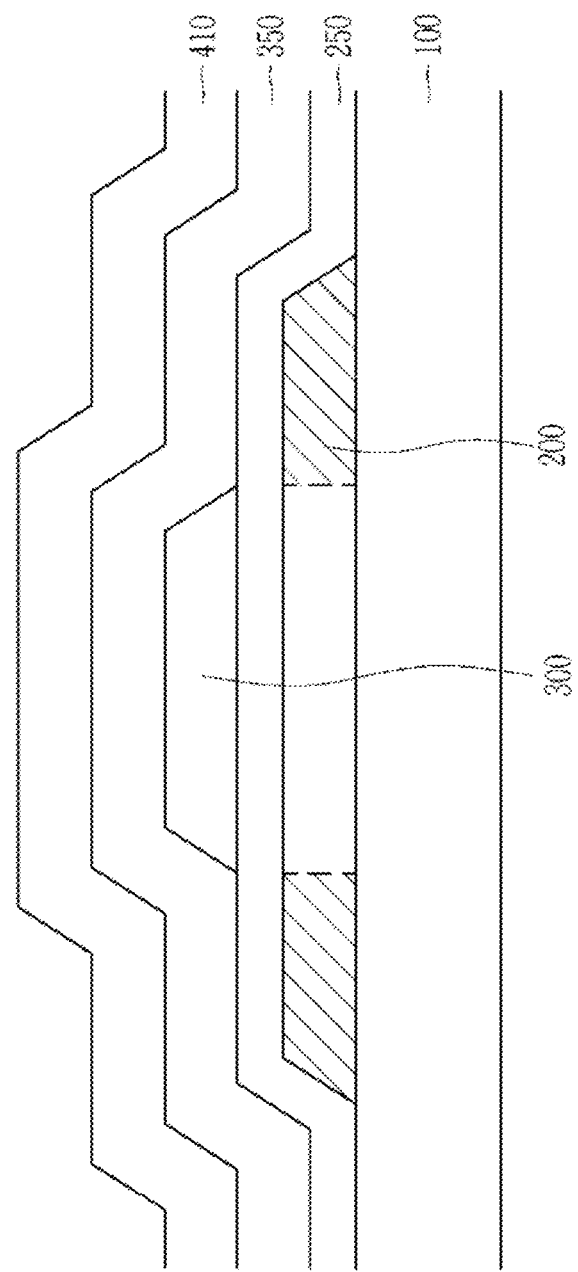

Next, as shown in FIG. 7B, a second insulating layer 350 and a third layer material 410 are sequentially deposited. Here, the second insulating layer 350 may be an inorganic insulating layer or an organic insulating layer, and in the case of the inorganic insulating layer, it may include silicon oxide ($SiO_2$) or silicon nitride ($Si_3N_4$) and also, a plurality of layers may be formed by respectively including a layer containing silicon oxide ($SiO_2$) and a layer including silicon nitride ($Si_3N_4$). The third layer material 410 may be a conductor.

Next, as shown in FIG. 7C, a third photoresist material 415 is deposited and exposed by using a mask 420 for a third layer. For example, the third photoresist material 415 may be exposed with a radiation (light) through the mask 420 for the third layer. Also, for example, the third photoresist material 415 may be a negative tone photoresist material.

Next, as shown in FIG. 7D, the exposed third photoresist material 415 is developed to form a third photoresist pattern 416, and then the third layer material 410 is etched using the third photoresist pattern 416 as an etch mask to form a third layer pattern 400.

Referring to FIG. 7D, the first layer pattern 200 and the second layer pattern 300 form a transistor, the second layer pattern 300 is a gate electrode, a portion that is not doped among the first layer pattern 200 is a channel region, and two doped portion are a source region and a drain region, respectively.

In addition, as shown in FIG. 7D, a capacitor may be formed in a region where the second layer pattern 300 and the third layer pattern 400 overlap.

In an exemplary embodiment of the present invention, the additional acid etching process is performed before the process of FIG. 7C in which the exposure process is performed after dry-etching the second layer pattern 300. For example, the additional acid etching process may be performed before the third photoresist material 415 is deposited. Since FIG. 7A shows that the photoresist is removed after the dry etching, the additional acid etching process may be performed after or before the process of removing the photoresist after the dry etching or along with the process of removing the photoresist. Here, the doping process may be disposed before or after the additional acid etching process. In addition, before and after the process illustrated in FIG. 7B as the following step of the process illustrated in FIG. 7A, that is, before or after the second insulating layer 350 or the third layer material 410 is deposited, the additional acid etching process may be performed. At this time, the etching solution used includes at least one of hydrochloric acid, sulfuric acid, or nitric acid.

Through this additional acid etching process, even if the yttrium compound is formed at the rear or the edge portion of the rear of the carrier substrate 500 disposed under the substrate 100 during the dry etching, it is removed, and defects do not occur due to the yttrium compound in the subsequent process.

After the process of FIG. 7D, the remained third photoresist pattern 416 is removed by a stripper in a stripping process.

In FIG. 7A to FIG. 7D, the first layer pattern 200 is disposed directly on the substrate 100, however according to an exemplary embodiment of the present invention, an additional layer or multiple additional layers may be disposed between the substrate 100 and the first layer pattern 200. Also, the carrier substrate 500 may be disposed under the substrate 100.

Hereinafter, a process sequence in which an additional acid etching process may be included is described based on an overall process sequence of an emissive display device. The emissive display device emits light from each pixel with different intensity and color and this emitted light constitutes an image. Each pixel included in the emissive display device may include a light-emitting diode as a display element capable of emitting light of a certain color. In an exemplary embodiment of the present invention, the light-emitting diode may include an organic light-emitting diode including an organic material as an emission layer. Alternatively, the light-emitting diode may include quantum dots and/or quantum rods as an emission layer.

FIG. 8 to FIG. 11 are flowcharts each showing a manufacturing method of a display device according to an exemplary embodiment of the present invention.

Figure 8:
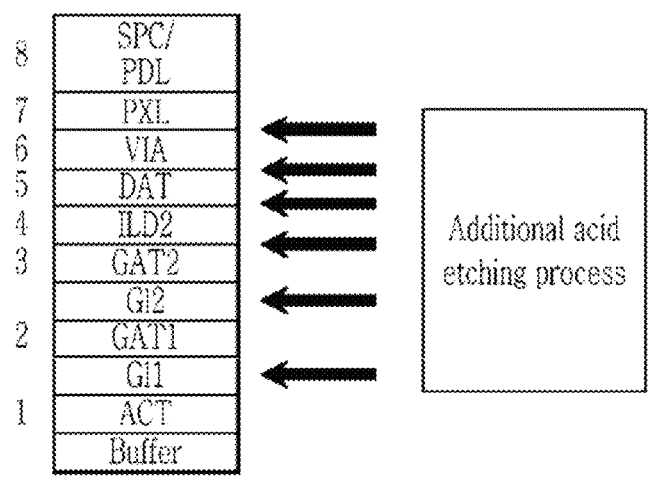
FIG. 8 to FIG. 11 are flowcharts each showing a manufacturing method of a display device according to an exemplary embodiment of the present invention.

First, FIG. 8 shows a process sequence of an emissive display device according to an exemplary embodiment of the present invention, and an emission layer, a cathode, and an encapsulation layer may be further formed after performing the process shown in FIG. 8.

FIG. 8 shows each layer from a bottom to a top based on a stacking order of the emissive display device, and the number on the left represents a layer containing the process performing the etching by using a mask. Here, in the language "performing the etching by using a mask", the mask may mean a photomask not an etch mask. In other words, the language "performing the etching by using a mask" may mean that first, a photoresist material is coated, baked, exposed to a light through a mask which is a photo mask, baked, then developed to form a photoresist pattern, and then, an etching process is performed using the photoresist pattern as an etch mask. The emissive display device according to an exemplary embodiment of the present invention shown in FIG. 8 is an exemplary embodiment of the present invention using a total of eight masks to a pixel definition layer PDL and a spacer SPC. For example, an organic material may be deposited on an anode PXL and etched by using an eighth mask to form the pixel definition layer PDL and the spacer SPC.

In the case of the emissive display device according to an exemplary embodiment of the present invention, an additional acid etching process may be included at least once more, and the step to be included is shown by an arrow in FIG. 8. The additional acid etching process may be added at the position indicated by the arrow, and at least one of the positions indicated by the arrows should include the additional acid etching process to prevent defects due to the yttrium compound formed at the rear or the edge portion of the rear of a carrier substrate during a dry etching process. At this time, the etching solution used to remove the yttrium compound includes at least one of hydrochloric acid, sulfuric acid, or nitric acid.

The dry etching is present before the step in which the additional acid etching process is disposed, and the exemplary embodiment of FIG. 8 is an exemplary embodiment of the present invention in which the overall etching process is performed by the dry etching except for an anode PXL. The etching process in forming the anode PXL may be a wet etching process.

The manufacturing sequence of the emissive display device according to the exemplary embodiment of FIG. 8 is described in detail as follows.

First, a buffer layer (Buffer) is formed on a substrate as a whole. At this time, the substrate may be a substrate having a flexible characteristic such as a plastic or polyimide (PI), and may be formed on a carrier substrate.

A semiconductor layer ACT is formed on the buffer layer (Buffer), and the dry etching is performed using a first mask. For example, a photoresist material may be deposited on the semiconductor layer ACT and exposed with a radiation (light) through the first mask then developed to form a photoresist pattern as an etch mask for the dry etching process. Here, the semiconductor layer ACT may include a polycrystalline semiconductor and/or an oxide semiconductor according to an exemplary embodiment of the present invention.

Next, a first gate insulating layer GI1 covering the semiconductor layer ACT is formed.

Then, a first gate conductive layer GAT1 is formed on the first gate insulating layer GI1 and is dry-etched by using a second mask. For example, a photoresist material may be deposited on the first gate conductive layer GAT1 and exposed with a radiation (light) through the second mask then developed to form a photoresist pattern as an etch mask for the dry etching process.

When an exposure process is present after a dry etching process, the additional acid etching process may be performed before the exposure process to remove the yttrium compound so that a defect is not generated in the layer under the photoresist pattern due to the yttrium compound included in the photoresist pattern. The semiconductor layer ACT is dry-etched and an exposure process is present for dry etching the first gate conductive layer GAT1 by using the second mask as a photomask, thereby performing the additional acid etching process before or after the step of forming the first gate insulating layer GI1. For example, the additional acid etching process may remove the yttrium compound formed at the rear or the edge portion of the rear of the carrier substrate during the dry etching process of forming the semiconductor layer ACT, and thus may prevent incorrect forming of the photoresist pattern in the exposure process for the dry etching of the first gate conductive layer GAT1. In FIG. 8, a place where the additional acid etching process is disposed is indicated by an arrow, and is illustrated to point to a middle of a layer representing the first gate insulating layer GI1. This means that the additional acid etching process may be performed before or after the step of forming the first gate insulating layer GI1.

After forming the first gate conductive layer GAT1 by the dry etching, a second gate insulating layer GI2 covering the first gate conductive layer GAT1 is formed.

Next, a second gate conductive layer GAT2 is formed on the second gate insulating layer GI2 and is dry-etched by using a third mask. For example, a photoresist material may be deposited on the second gate conductive layer GAT2 and exposed with a radiation (light) through the third mask then developed to form a photoresist pattern as an etch mask for the dry etching process.

The first gate conductive layer GAT1 is dry-etched and the exposure process for dry etching the second gate conductive layer GAT2 by using the third mask as a photomask is present, thereby performing the additional acid etching process before or after the forming of the second gate insulating layer GI2.

After forming the second gate conductive layer GAT2 by the dry etching, an interlayer insulating layer ILD2 is formed to cover the second gate conductive layer GAT2, and an opening is formed by using a fourth mask in the interlayer insulating layer ILD2. In this case, the formation of the opening is performed by the dry etching. For example, a photoresist material may be deposited on the interlayer insulating layer ILD2 and exposed with a radiation (light) through the fourth mask then developed to form a photoresist pattern as an etch mask for the dry etching process. Here, the interlayer insulating layer ILD2 may be an inorganic insulating layer or an organic insulating layer, and in the case of the inorganic insulating layer, it may include silicon oxide ($SiO_2$) or silicon nitride ($Si_3N_4$), and also, a plurality of layers may be formed by respectively including a layer containing silicon oxide ($SiO_2$) and a layer including silicon nitride ($Si_3N_4$).

Since the second gate conductive layer GAT2 is dry-etched and the exposure process is present for dry etching the interlayer insulating layer ILD2 by using the fourth mask as a photomask, the additional acid etching process may be performed before the exposure process by using the fourth mask as a photomask after the dry etching of the second gate conductive layer GAT2. Since FIG. 8 shows that a separate layer is not formed between the second gate conductive layer GAT2 and the interlayer insulating layer ILD2, an arrow representing where the additional acid etching process is disposed is shown to be at the boundary of two layers. That is, when the arrow is disposed on the boundary of two layers, it indicates that the additional acid etching process is disposed between the processes of two layers.

A data conductive layer DAT is formed by using a fifth mask by the dry etching after forming the opening in the interlayer insulating layer ILD2. For example, a photoresist material may be deposited on the data conductive layer DAT and exposed with a radiation (light) through the fifth mask then developed to form a photoresist pattern as an etch mask for the dry etching process. Since the interlayer insulating layer ILD2 is dry-etched and the exposure process for dry etching the data conductive layer DAT by using a fifth mask as a photomask is present, the additional acid etching process may be performed before performing the exposure process by using the fifth mask as a photomask after forming the opening in the interlayer insulating layer ILD2.

An upper insulating layer VIA is formed after forming the data conductive layer DAT, and an opening is formed in the upper insulating layer VIA by using a sixth mask. In this case, the formation of the opening is performed by dry etching. For example, a photoresist material may be deposited on the upper insulating layer VIA and exposed with a radiation (light) through the sixth mask then developed to form a photoresist pattern as an etch mask for the dry etching process. Here, the upper insulating layer VIA may be an inorganic insulating layer or an organic insulating layer, and in the case of the inorganic insulating layer, it may include silicon oxide ($SiO_2$) or silicon nitride ($Si_3N_4$), and also, a plurality of layers may be formed by respectively including a layer containing silicon oxide ($SiO_2$) and a layer including silicon nitride ($Si_3N_4$). The upper insulating layer VIA may be formed relatively thick so that the upper layer has a flat characteristic. Since the data conductive layer DAT is dry-etched and the exposure process is present for dry etching the upper insulating layer VIA by using the sixth mask as a photomask, the additional acid etching process may be performed before performing the exposure process by using the sixth mask as a photomask after forming the data conductive layer DAT.

After forming the opening in the upper insulating layer VIA, an anode PXL is formed by wet etching by using a seventh mask. For example, a photoresist material may be deposited on the anode PXL and exposed with a radiation (light) through the seventh mask then developed to form a photoresist pattern as an etch mask for the wet etching process. Since the upper insulating layer VIA is dry-etched and the exposure process is present for the wet etching of the anode PXL by using the seventh mask as a photomask, the additional acid etching process may be performed before performing the exposure process by using the seventh mask as a photomask after forming the opening in the upper insulating layer VIA.

The organic material is deposited after forming the anode PXL and is etched by using an eighth mask to form a pixel definition layer PDL and a spacer SPC. In this case, the formation of the pixel definition layer PDL and the spacer SPC is performed by dry etching. For example, a photoresist material may be deposited on the organic material and exposed with a radiation (light) through the eighth mask then developed to form a photoresist pattern as an etch mask for the dry etching process. The pixel definition layer PDL and the spacer SPC may have different heights, and a halftone mask may be used to form two layers (the pixel definition layer PDL and the spacer SPC) having different heights with one eighth mask. At this time, the photoresist pattern forming the pixel definition layer PDL may be exposed as a halftone region of the eighth mask. Snice the anode PXL is wet-etched, the additional acid etching process is not required before performing the exposure process by using the eighth mask as a photomask for forming the anode PXL.

The exemplary embodiment of FIG. 8 shows that additional acid etching processes may be performed at various steps, but it is not necessary to perform the additional acid etching processes at all stages. For example, it may be sufficient to perform the additional acid etching processes shown in FIG. 8 at least once. Whether the additional acid etching process is to be actually performed to prevent the defect caused by the yttrium compound in the layer is determined by confirming the layer in which the defect occurs by the yttrium compound and performing the additional acid etching process before proceeding with the exposure process on the layer.

Hereinafter, an exemplary embodiment of the present invention in which the additional acid etching process is applied to an emissive display device according to an exemplary embodiment of the present invention is described with reference to FIG. 9.

Figure 9:
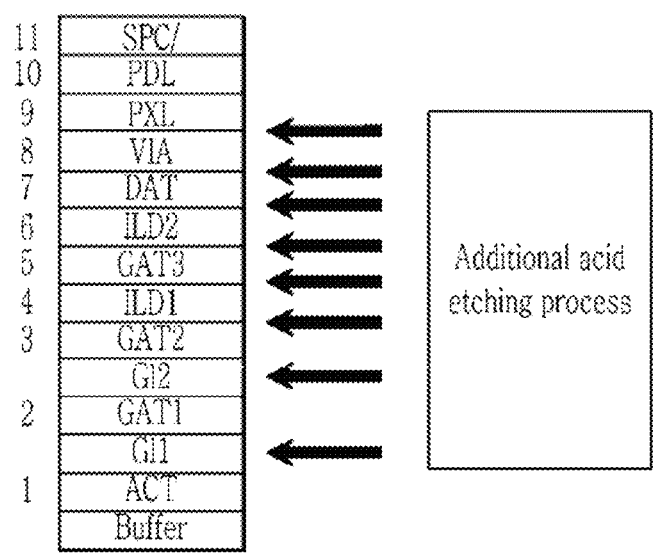

An exemplary embodiment of the present invention shown in FIG. 9 is an exemplary embodiment of the present invention in which eleven masks are used compared to the exemplary embodiment in FIG. 8. FIG. 9 shows the process sequence of the emissive display device according to an exemplary embodiment of the present invention, and an emission layer, a cathode, and an encapsulation layer may be further formed after performing the process shown in FIG. 9. In an exemplary embodiment of the present invention shown in FIG. 9, the number of masks is increased by one due to the presence of the third gate conductive layer GAT3, and the number of masks is increased by one to form an opening in the first interlayer insulating layer ILD1 disposed under the third gate conductive layer GAT3, unlike in FIG. 8, and the pixel definition layer PDL and the spacer SPC are respectively formed by one mask, thereby this is an exemplary embodiment in which the total number of masks is increased by three.

An exemplary embodiment of the present invention shown in FIG. 9 is an exemplary embodiment of the present invention in which the steps before forming the anode PXL are all performed by the dry etching, and the additional acid etching process may be performed before performing the exposure process by using a next mask after the dry etching. For example, since the separate mask is not respectively used to form the opening in the first gate insulating layer GI1 and the second gate insulating layer GI2 like the exemplary embodiment of FIG. 8, the additional acid etching process may be performed after or before depositing the first gate insulating layer GI1, or after or before depositing the second gate insulating layer GI2. That is, since the semiconductor layer ACT is dry-etched and the exposure process for dry etching the first gate conductive layer GAT1 by using the second mask as a photomask is present, the additional acid etching process may be performed before or after forming the first gate insulating layer GI1. Also, since the first gate conductive layer GAT1 is dry-etched and the exposure process for dry etching the second gate conductive layer GAT2 by using the third mask as a photomask is present, the additional acid etching process may be performed before or after the step of forming the second gate insulating layer GI2.

Among the processes of FIG. 9, the process (a first interlayer insulating layer ILD1, a third gate conductive layer GAT3) that is not shown in FIG. 8 is mainly described as follows.

After the second gate conductive layer GAT2 is formed by the dry etching by using the third mask, a first interlayer insulating layer ILD1 covering the second gate conductive layer GAT2 is formed. An opening is formed in the first interlayer insulating layer ILD1 by using a fourth mask. In this case, the formation of the opening is performed by the dry etching. For example, a photoresist material may be deposited on the first interlayer insulating layer ILD1 and exposed with a radiation (light) through the fourth mask then developed to form a photoresist pattern as an etch mask for the dry etching process. Here, the first interlayer insulating layer ILD1 may be an inorganic insulating layer or an organic insulating layer, and in the case of the inorganic insulating layer, it may include silicon oxide ($SiO_2$) or silicon nitride ($Si_3N_4$), and also, a plurality of layers may be formed by respectively including a layer containing silicon oxide ($SiO_2$) and a layer including silicon nitride ($Si_3N_4$).

Since the second gate conductive layer GAT2 is dry-etched and the exposure process for dry etching the first interlayer insulating layer ILD1 by using the fourth mask is present, the additional acid etching process may be performed before performing the exposure process by using the fourth mask as a photomask after the dry etching of the second gate conductive layer GAT2.

After forming the opening in the first interlayer insulating layer ILD1, a third gate conductive layer GAT3 is formed by using a fifth mask with the dry etching. For example, a photoresist material may be deposited on the third gate conductive layer GAT3 and exposed with a radiation (light) through the fifth mask then developed to form a photoresist pattern as an etch mask for the dry etching process. Since the first interlayer insulating layer ILD1 is dry-etched and the exposure process for dry etching the third gate conductive layer GAT3 by using the fifth mask as a photomask is present, the additional acid etching process may be performed before performing the exposure process by using the fifth mask as a photomask after forming the opening in the first interlayer insulating layer ILD1.

A second interlayer insulating layer ILD2 is formed after forming the third gate conductive layer GAT3 and an opening is formed in the second interlayer insulating layer ILD2 by using a sixth mask. In this case, the forming of the opening in the second interlayer insulating layer ILD2 is performed by dry etching. For example, a photoresist material may be deposited on the second interlayer insulating layer ILD2 and exposed with a radiation (light) through the sixth mask then developed to form a photoresist pattern as an etch mask for the dry etching process. The second interlayer insulating layer ILD2 may be an inorganic insulating layer or an organic insulating layer, and in the case of the inorganic insulating layer, it may include silicon oxide ($SiO_2$) or silicon nitride ($Si_3N_4$), and also, a plurality of layers it may be formed by respectively including a layer containing silicon oxide ($SiO_2$) and a layer including silicon nitride ($Si_3N_4$). The second interlayer insulating layer ILD2 may be formed relatively thick compared to the first interlayer insulating layer ILD1. Since the third gate conductive layer GAT3 is dry-etched and the exposure process for dry etching the second interlayer insulating layer ILD2 by using the sixth mask is present, the additional acid etching process may be performed before performing the exposure process by using the sixth mask as a photomask after forming the third gate conductive layer GAT3.

A data conductive layer DAT is formed by the dry etching by using a seventh mask after forming the opening in the second interlayer insulating layer ILD2. For example, a photoresist material may be deposited on the data conductive layer DAT and exposed with a radiation (light) through the seventh mask then developed to form a photoresist pattern as an etch mask for the dry etching process. Since the second interlayer insulating layer ILD2 is dry-etched and the exposure process is present for dry etching the data conductive layer DAT by using the seventh mask, the additional acid etching process may be performed before performing the exposure process by using the seventh mask as a photomask after forming the opening in the second interlayer insulating layer ILD2.

An upper insulating layer VIA is formed after forming the data conductive layer DAT, and an opening is formed in the upper insulating layer VIA by using the eighth mask. For example, a photoresist material may be deposited on the upper insulating layer VIA and exposed with a radiation (light) through the eighth mask then developed to form a photoresist pattern as an etch mask for the dry etching process. Here, the upper insulating layer VIA may be an inorganic insulating layer or an organic insulating layer, and in the case of the inorganic insulating layer, it may include silicon oxide ($SiO_2$) or silicon nitride ($Si_3N_4$), and also, a plurality of layers may be formed by respectively including a layer containing silicon oxide ($SiO_2$) and a layer including silicon nitride ($Si_3N_4$). The upper insulating layer VIA may be formed relatively thick so that the upper layer has a flat characteristic. Since the data conductive layer DAT is dry etched and the exposure process is present for dry etching the upper insulating layer VIA using the eighth mask, the additional acid etching process may be performed before proceeding with the exposure process by using the eighth mask as a photomask after forming the data conductive layer DAT.

The anode PXL is wet etched by using a ninth mask after forming the opening in the upper insulating layer VIA. For example, a photoresist material may be deposited on the anode PXL and exposed with a radiation (light) through the ninth mask then developed to form a photoresist pattern as an etch mask for the wet etching process.

Next, a pixel definition layer PDL is formed by using a tenth mask and then a spacer SPC is formed by using an eleventh mask.

In the exemplary embodiment of FIG. 9, the additional acid etching process may be performed at various steps, but it is not necessary to perform the additional acid etching process at all steps. That is, it may be sufficient to perform the additional acid etching processes shown in FIG. 9 at least once. Whether the additional acid etching process is actually performed to prevent the defect caused by the yttrium compound in the layer is determined by confirming the layer in which the defect occurs by the yttrium compound and performing the additional acid etching process before proceeding with the exposure process in the layer.

Hereinafter, an exemplary embodiment of the present invention which includes applying the additional acid etching process to an emissive display device according to an exemplary embodiment of the present invention is described with reference to FIG. 10.

Figure 10:
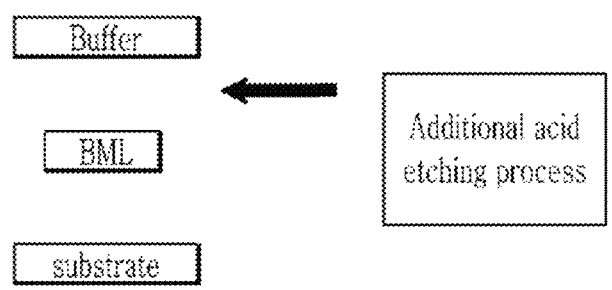

FIG. 10 shows an exemplary embodiment of the present invention further having a metal layer BML disposed between the substrate and the buffer layer. The subsequent processes after forming the buffer layer may be the same as those in the exemplary embodiment of FIG. 8 and/or the exemplary embodiment of FIG. 9.

According to FIG. 10, since the metal layer BML is dry etched by using one mask, the additional acid etching process may be performed after forming the metal layer BML. Referring to the exemplary embodiments of FIG. 8 and FIG. 9, the buffer layer does not include the separate exposure process and the exposure process is not included in the semiconductor layer ACT disposed thereon, but the exemplary embodiment of FIG. 10 may include the additional acid etching process before or after the formation of the buffer layer. For example, the additional acid etching process may remove the yttrium compound formed at the rear or the edge portion of the rear of the carrier substrate during the dry etching process of forming the metal layer BML, and thus may prevent incorrect forming of a photoresist pattern in a subsequent process after the formation of the buffer layer.

Figure 11:
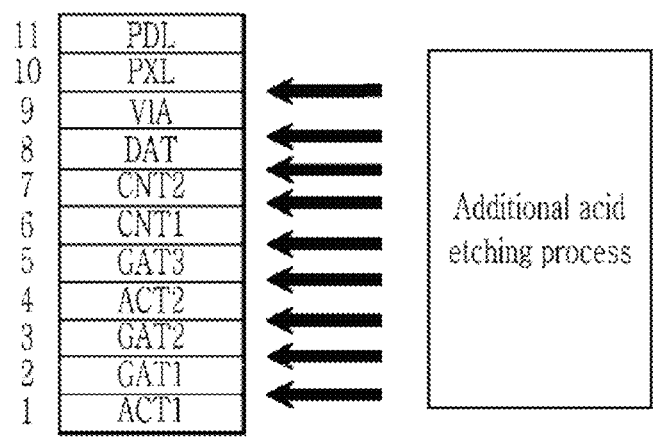

Hereinafter, an exemplary embodiment of the present invention which includes applying the additional acid etching process to an emissive display device according to an exemplary embodiment of the present invention is described with reference to FIG. 11. FIG. 11 shows the process sequence of the emissive display device according to an exemplary embodiment of the present invention, and an emission layer, a cathode, and an encapsulation layer may be further formed after performing the process shown in FIG. 11.

The exemplary embodiment of FIG. 11 includes two semiconductor layers (a first semiconductor layer ACT1 and a second semiconductor layer ACT2), unlike FIG. 8 and FIG. 9. One of two semiconductor layers may be a semiconductor layer including a polycrystalline semiconductor, and the other may be a semiconductor layer including an oxide semiconductor. In the exemplary embodiment of FIG. 11, it is described that the first semiconductor layer ACT1 is the polycrystalline semiconductor layer and the second semiconductor layer ACT2 is the oxide semiconductor layer.

In addition, in FIG. 11, unlike FIG. 8 and FIG. 9, the insulating layer that is not etched using a separate mask is not separately shown. However, since the insulating layer is disposed between the conductive layers or between the conductive layer and the semiconductor layer, the position of the insulating layer may be easily confirmed through FIG. 11.

According to FIG. 11, the first semiconductor layer ACT1 is formed by the dry etching using the first mask, and an insulating layer (a first gate insulating layer) is deposited on the first semiconductor layer ACT1. The first semiconductor layer ACT1 may include the polycrystalline semiconductor.

Next, a first gate conductive layer GAT1 is formed by the dry etching using the second mask, and an insulating layer (a second gate insulating layer) is deposited on the first gate conductive layer GAT1.

Then, the dry etching is performed with a third mask to form a second gate conductive layer GAT2, and an insulating layer (a third gate insulating layer) is deposited thereon.

Thereafter, a second semiconductor layer ACT2 is formed by the dry etching with a fourth mask, and an insulating layer (a fourth gate insulating layer) is deposited thereon. The second semiconductor layer ACT2 may include an oxide semiconductor.

Thereafter, the dry etching with a fifth mask is performed to form a third gate conductive layer GAT3, an insulating layer (a first interlayer insulating layer) is formed thereon, and the dry etching is performed with two masks (a sixth mask and a seventh mask) each to form an opening in the plurality of insulating layers (the first interlayer insulating layer, the third gate insulating layer, the second gate insulating layer, and the first gate insulating layer), so as to form a first contact hole CNT1 and a second contact hole CNT2. Some of the first contact hole CNT1 and some of the second contact hole CNT2 may overlap each other and form respective openings. The others of the first contact hole CNT1 do not overlap the other of the second contact hole CNT2 and form separate openings with the second contact hole CNT2. When forming the opening in the plurality of insulating layers, the depth of the opening may need to be deeply formed, so the deep opening is formed using two masks. However, if it is possible to form the opening by using a single mask, it may be formed through a single mask.

After that, the dry etching is performed with an eighth mask to form a data conductive layer DAT, an upper insulating layer VIA is deposited thereon, and the upper insulating layer VIA is dry etched with a ninth mask to form an opening.

Thereafter, the anode PXL is formed by the wet etching with a tenth mask, and the pixel definition layer PDL is formed thereon with an eleventh mask. The pixel definition layer PDL may be formed with a dry etching process.

In the exemplary embodiment of FIG. 11, the wet etching process is applied at the layer of the anode PXL, and all the layers underneath are dry etched. As a result, the additional acid etching process may be performed before the exposure process using the mask as a photomask next after performing the dry etching using each mask.

The exemplary embodiment of FIG. 11 shows that the additional acid etching process may be performed at various stages, but it is not necessary to perform the additional acid etching process at all steps. It may be sufficient to perform at least one of the possible additional acid etching processes shown in FIG. 11. Whether the additional acid etching process is to be actually performed to prevent the defect caused by the yttrium compound in the layer is determined by confirming the layer in which the defect occurs by the yttrium compound and performing the additional acid etching process before proceeding with the exposure process in the layer.

FIG. 8 to FIG. 11 mainly describe the manufacturing method of the emissive display device. However, in a liquid crystal display which has a constant backlight, a similar process is performed except for the emission layer, so the present invention may be applied to the liquid crystal display.

While the present invention has been described in connection with what is presently considered to be practical exemplary embodiments, it is to be understood that the present invention is not limited to the disclosed exemplary embodiments. On the contrary, it is intended to cover various modifications and equivalent arrangements included within the spirit and scope of the present invention as defined in the appended claims.

What is claimed is:

1. A method of manufacturing a display device in a chamber in which a material including yttrium is coated on an inner surface, comprising:
   forming a first layer pattern by dry etching on a substrate;
   depositing a second layer material on the first layer pattern;
   forming a photoresist pattern on the second layer material;
   completing a second layer pattern by using the photoresist pattern as an etch mask; and
   performing an additional acid etching process by using an etching solution including at least one of hydrochloric acid, sulfuric acid, or nitric acid before the forming of the photoresist pattern on the second layer material and after the dry etching to form the first layer pattern.

2. The manufacturing method of claim 1, wherein
   the forming of the photoresist pattern on the second layer material includes depositing a photoresist material and completing the photoresist pattern by exposing the photoresist material.

3. The manufacturing method of claim 2, wherein
   the additional acid etching process is performed prior to the completing of the photoresist pattern by the exposing of the photoresist material.

4. The manufacturing method of claim 3, wherein
   the additional acid etching process is performed between the depositing of the photoresist material and the completing of the photoresist pattern by the exposing of the photoresist material.

5. The manufacturing method of claim 1, wherein
   the forming of the first layer pattern by the dry etching includes:
   depositing a first layer material on the substrate;
   depositing a first photoresist on the first layer material; and
   exposing the first photoresist to complete the first photoresist pattern.

6. The manufacturing method of claim 5, further comprising
   removing or cleaning the first photoresist pattern remaining on the first layer pattern after the first layer pattern is completed.

7. The manufacturing method of claim 6, wherein
   the additional acid etching process is performed before the removing or cleaning of the first photoresist pattern.

8. The manufacturing method of claim 6, wherein
   the additional acid etching process is performed along with the removing or cleaning of the first photoresist pattern.

9. The manufacturing method of claim 1, wherein
   the first layer pattern and the second layer pattern are each independently a conductive layer, a semiconductor layer, or an insulating layer.

10. The manufacturing method of claim 1, wherein
    the additional acid etching process removes a first yttrium compound generated by yttrium coating on the inner surface of the chamber.

11. The manufacturing method of claim 10, wherein
    the first yttrium compound is $Y_2O_3$.

12. The manufacturing method of claim 11, wherein
    a carrier substrate attached to the substrate is disposed under the substrate, and
    the first yttrium compound is formed on a rear or an edge portion of the rear of the carrier substrate during the dry etching.

13. The manufacturing method of claim 12, wherein the first yttrium compound is converted into $YF_3$ of a second yttrium compound in a cleaning process.

14. The manufacturing method of claim 1, wherein
the first layer pattern is a semiconductor layer,
the second layer pattern is a gate conductive layer, and
the manufacturing method further comprises:
forming a first gate insulating layer disposed between the semiconductor layer and the gate conductive layer;
forming a second gate insulating layer covering the gate conductive layer; and
forming a third layer pattern on the second gate insulating layer by using a third layer mask as a photomask,
wherein the additional acid etching process is further performed after the completing of the second layer pattern and before exposing with the third layer mask to form the third layer pattern.

15. The manufacturing method of claim 14, wherein
all conductive layers formed closer to the substrate than an anode among the conductive layers included in the display device are formed by the dry etching, and the anode is formed by wet etching.

\* \* \* \* \*